(12) United States Patent
Freer et al.

(10) Patent No.: US 10,704,827 B2
(45) Date of Patent: Jul. 7, 2020

(54) SYSTEMS AND METHODS FOR TESTING ELECTRICAL CONNECTORS

(71) Applicants: Benjamin Avery Freer, Syracuse, NY (US); Joseph Michael Manahan, Manlius, NY (US); Charles John Luebke, Hartland, WI (US); David McClanahan, Greenfield, WI (US)

(72) Inventors: Benjamin Avery Freer, Syracuse, NY (US); Joseph Michael Manahan, Manlius, NY (US); Charles John Luebke, Hartland, WI (US); David McClanahan, Greenfield, WI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 717 days.

(21) Appl. No.: 15/206,522

(22) Filed: Jul. 11, 2016

(65) Prior Publication Data
US 2017/0184343 A1 Jun. 29, 2017

Related U.S. Application Data

(60) Provisional application No. 62/271,822, filed on Dec. 28, 2015.

(51) Int. Cl.
*F25D 29/00* (2006.01)
*B60P 3/20* (2006.01)
(Continued)

(52) U.S. Cl.
CPC .............. *F25D 29/006* (2013.01); *B60P 3/20* (2013.01); *F25D 11/003* (2013.01); *G01R 31/08* (2013.01);
(Continued)

(58) Field of Classification Search
CPC .... G01R 31/021; G01R 31/045; G01R 31/08; B60P 3/20; F25D 11/003; F25D 29/006; H02H 3/17
See application file for complete search history.

(56) References Cited

U.S. PATENT DOCUMENTS 4,234,926 A 11/1980 Wallace et al.
4,525,715 A 6/1985 Smith
(Continued)

FOREIGN PATENT DOCUMENTS

CN 103353727 10/2013
CN 204333400 5/2015
(Continued)

OTHER PUBLICATIONS

EP 14166466.4 to provide priority for US 2017/0110872. Apr. 29, 2014. (Year: 2014).*
(Continued)

*Primary Examiner* — Thienvu V Tran
*Assistant Examiner* — Christopher J Clark
(74) *Attorney, Agent, or Firm* — King & Spalding LLP

(57) ABSTRACT

An electrical connector testing system can include a first connector end and a controller coupled to first connector end. The system can also include an electrical load coupled to the first connector end, where the electrical load includes an electrical cable and a second connector end coupled to an end of the electrical cable. The controller can determine whether an adverse electrical condition exists with respect to the electrical load before allowing power to flow between the first connector end and the second connector end.

13 Claims, 15 Drawing Sheets

(51) Int. Cl.
| | |
|---|---|
| *H02H 11/00* | (2006.01) |
| *G01R 31/69* | (2020.01) |
| *G01R 31/08* | (2020.01) |
| *F25D 11/00* | (2006.01) |
| *H02H 7/20* | (2006.01) |
| *H02H 3/33* | (2006.01) |
| *H02H 3/17* | (2006.01) |
| *H02H 3/04* | (2006.01) |

(52) U.S. Cl.
CPC ............... *G01R 31/69* (2020.01); *H02H 7/20* (2013.01); *H02H 11/00* (2013.01); *H02H 11/002* (2013.01); *H02H 3/044* (2013.01); *H02H 3/17* (2013.01); *H02H 3/33* (2013.01)

(56) References Cited

U.S. PATENT DOCUMENTS

| | | |
|---|---|---|
| 4,604,505 A | 8/1986 | Henninger |
| 4,885,564 A | 12/1989 | Vercellotti et al. |
| 5,268,644 A | 12/1993 | Klassen et al. |
| 5,469,064 A | 11/1995 | Kerschner et al. |
| 5,552,701 A | 9/1996 | Veteran et al. |
| 5,737,168 A * | 4/1998 | Baker ............... H02H 3/207 361/84 |
| 5,903,718 A | 5/1999 | Marik |
| 5,946,180 A | 8/1999 | Simpson |
| 6,006,844 A | 12/1999 | Van Puymbroeck et al. |
| 6,351,827 B1 | 2/2002 | Co et al. |
| 6,516,053 B1 | 2/2003 | Ryan et al. |
| 6,807,035 B1 | 10/2004 | Baldwin et al. |
| 6,970,534 B1 | 11/2005 | Brumble |
| 6,992,491 B1 | 1/2006 | Lo et al. |
| 7,143,659 B2 | 12/2006 | Stout et al. |
| 7,462,957 B2 | 12/2008 | Camwell et al. |
| 7,526,971 B2 | 5/2009 | Mandziuk et al. |
| 7,665,542 B2 | 2/2010 | Stockton |
| 8,284,066 B2 | 10/2012 | Perten et al. |
| 8,475,192 B2 | 7/2013 | Kantor |
| 9,525,247 B2 * | 12/2016 | Seff ............... G01R 19/165 |
| 2001/0050559 A1 | 12/2001 | Wisler et al. |
| 2002/0097546 A1 | 7/2002 | Weinberger |
| 2007/0076334 A1 | 4/2007 | Battani et al. |
| 2009/0201027 A1* | 8/2009 | Sexton ............... H02H 11/002 324/527 |
| 2009/0228155 A1 | 9/2009 | Slifkin et al. |
| 2010/0000792 A1 | 1/2010 | Alberty |
| 2011/0001486 A1 | 1/2011 | Abouda et al. |
| 2011/0320056 A1 | 12/2011 | Brown et al. |
| 2012/0206100 A1 | 8/2012 | Brown et al. |
| 2013/0001052 A1 | 1/2013 | Kantor |
| 2013/0065416 A1 | 3/2013 | Kantor |
| 2013/0162262 A1* | 6/2013 | Johnson ............... G01R 31/021 324/539 |
| 2013/0182361 A1 | 7/2013 | Sexton et al. |
| 2013/0207455 A1 | 8/2013 | Doljack |
| 2014/0077821 A1 | 3/2014 | Reed et al. |
| 2014/0244058 A1* | 8/2014 | Zweigle ............... H02J 13/001 700/291 |
| 2015/0316589 A1 | 11/2015 | Mazara Diaz et al. |
| 2015/0316600 A1 | 11/2015 | Davis |
| 2016/0178682 A1* | 6/2016 | Eldridge ............... H01R 13/713 324/538 |
| 2017/0110872 A1* | 4/2017 | Saarinen ............... H02H 3/06 |
| 2018/0011132 A1* | 1/2018 | Freer ............... F25D 29/003 |
| 2018/0087867 A1 | 3/2018 | Tower |
| 2018/0323549 A1 | 11/2018 | Vogel et al. |
| 2018/0339377 A1 | 11/2018 | Schneeberger et al. |

FOREIGN PATENT DOCUMENTS

| | | |
|---|---|---|
| EP | 2615469 | 7/2013 |
| GB | 2204198 | 11/1988 |
| JP | 2002318047 | 10/2002 |
| WO | WO 2008/014276 | 1/2008 |
| WO | 2010119093 | 10/2010 |
| WO | WO 2012/166984 | 12/2012 |

OTHER PUBLICATIONS

A. Semenova, International Search Report and Written Opinion issued in application PCT/US2017/041368, completion date Oct. 26, 2017, dated Nov. 9, 2017, 7 pages, Federal Institute of Industrial Property, Moscow, Russia.

A. Semenova, International Search Report and Written Opinion issued in PCT/US2017/020472, completion date May 28, 2017, dated Jun. 8, 2017, 6 pages, Federal Institute of Industrial Property, Moscow, Russia.

A. Semenova, International Search Report and Written Opinion of the International Searching Authority for PCT/US2016/066568, completion dated Mar. 15, 2017, dated Apr. 13, 2017, 7 pages, Federal Institute of Industrial Property, Moscow, Russia.

Zhao Xue, Written Opinion issued in Singapore Patent Application No. 11201705658W, dated Apr. 12, 2018, 7 pages, Intellectual Property Office of Singapore, Singapore.

Machine translation of abstract of JP2002318047, via Espacenet, 2 pages.

E. Ushakova, International Search Report and Written Opinion issued in International Application No. PCT/US2015/000213, completion date May 24, 2016, dated Jun. 2, 2016, 7 pages, Federal Institute of Industrial Property, Moscow, Russia.

Partial Supplemental European Search Report under Rule 164, paragraph 1 of the European Patent Convention issued in EP15873771, dated Oct. 15, 2018, pp. 1-15, European Patent Office, Munich, Germany.

Singapore Search Report issued in patent application No. 11201805516W, dated Feb. 21, 2019, 8 pages Intellectual Property Office of Singapore.

Extended European Search Report issued in EP Application No. 15873771 dated Jan. 31, 2019, 14 pages.

Chinese Office Action and Search Report issued in patent application No. 201580072857.7, dated Jun. 27, 2019, includes 26 pages with translation.

Extended European Search Report issued in EP Application No. 16882315, dated Aug. 6, 2019, 7 pages (reference in search report WO 2016/105486 has a counterpart US 2016/0178682 that has already be cited in the record of U.S. Appl. No. 15/206,522).

Singapore Search Report issued in patent application No. 11201805516W, dated Nov. 18, 2019, 6 pages Intellectual Property Office of Singapore.

Extended European Search Report issued in EP Application No. 17770808.8 dated Dec. 12, 2019, 9 pages.

Chinese Office Action and Search Report issued in application No. 201680071764.7, dated Apr. 2, 2020, 22 pages including translation.

* cited by examiner

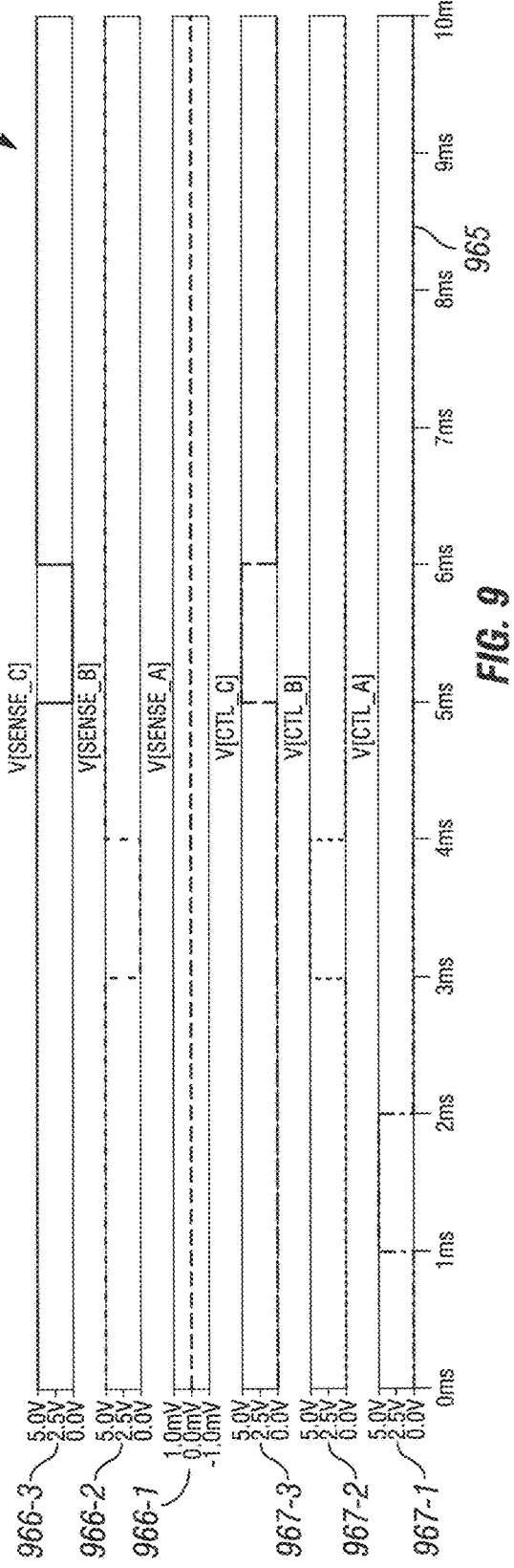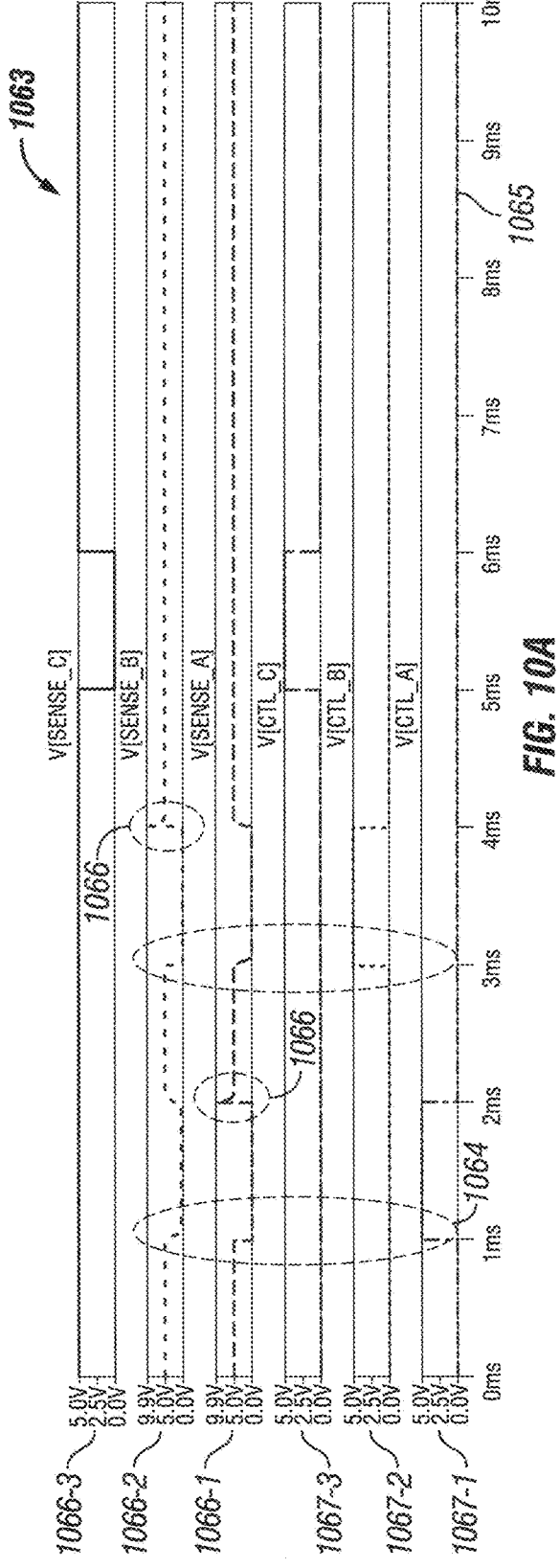
FIG. 9
FIG. 10A

SYSTEMS AND METHODS FOR TESTING ELECTRICAL CONNECTORS

CROSS-REFERENCE TO RELATED APPLICATIONS

This application claims priority under 35 U.S.C. § 119 to U.S. Provisional Patent Application Ser. No. 62/271,822, titled "Systems and Methods For Testing Electrical Connectors" and filed on Dec. 28, 2015, the entire contents of which are hereby incorporated herein by reference in its entirety.

TECHNICAL FIELD

The present disclosure relates generally to electrical connectors, and more particularly to systems, methods, and devices for testing electrical connectors for reefer containers.

BACKGROUND

Portable devices often contain components requiring electrical power and in some cases the required electrical power can have relatively high voltage and current ratings. Receptacles have been designed to provide power to such portable devices. Often, receptacles are designed with mechanical interlocking features to ensure that a connector from the device is properly inserted into the receptacle. However, as described further below, such mechanical interlocking features do not typically provide electrical testing features.

Refrigerated shipping containers (also called reefer containers) are one example of a portable device that requires power. Refrigerated shipping containers are used to ship goods throughout the world. Such refrigerated shipping containers can be transported on trains, trucks, and ships and the containers are often stationed at ports, warehouses, and distribution centers. While the refrigerated containers are located in these various modes of transportation and storage, they often need electrical power to operate the refrigeration unit of the container. The refrigeration units in refrigerated shipping containers typically operate at relatively high voltage and current ratings. For example, many refrigerated shipping containers operate at 480 volts AC and 8-15 amps.

SUMMARY

In general, in one aspect, the disclosure relates to an electrical connector testing system. The electrical connector testing system can include a first connector end, and a controller coupled to first connector end. The electrical connector testing system can also include an electrical load coupled to the first connector end, where the electrical load comprises an electrical cable and a second connector end coupled to an end of the electrical cable. The controller can determine whether an adverse electrical condition exists with respect to the electrical load before allowing power to flow between the first connector end and the second connector end.

In another aspect, the disclosure can generally relate to a reefer receptacle. The reefer receptacle can include a connector end configured to couple to an electrical connector of a reefer container, and an electrical interlock coupled to the connector end. The reefer receptacle can also include a breaker coupled to the electrical interlock, and a power supply coupled to the breaker. The reefer receptacle can further include a controller coupled to the power supply, where the controller performs at least one test to determine if an adverse electrical condition exists prior to putting the reefer container in service. The controller can determine that no adverse electrical condition exists with respect to the electrical load before allowing power to flow between the connector end and the electrical connector of the reefer receptacle.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

FIGS. 7-10B show graphical examples of how an example controller can be used to detect various faults in the electrical cable and/or connector that feeds power to a reefer container.

DETAILED DESCRIPTION

Figure 1:
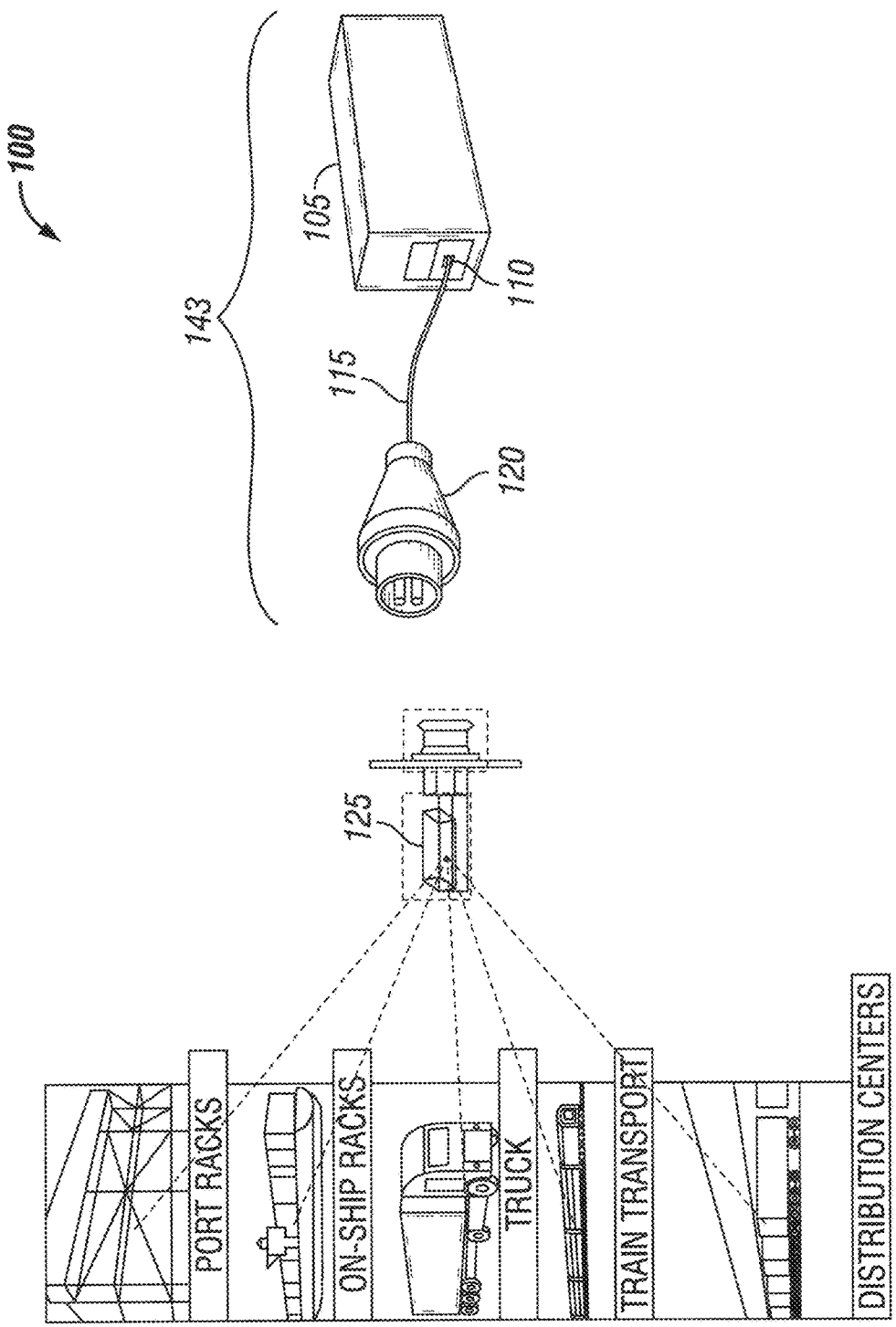
FIG. 1 illustrates an example of a typical reefer container and a reefer receptacle currently used in the art.

In general, example embodiments provide systems, methods, and devices for systems for testing electrical connectors. While example systems for testing electrical connectors that are described herein are directed to reefer containers, example embodiments can be used with electrical connectors used for any of a number of other applications. Further, example embodiments can be used in one or more of any of a number of environments, including but not limited to hazardous (e.g., explosive) environments, indoors, outdoors, cold temperatures, hot temperatures, high humidity, marine environments, and low oxygen environments.

In addition, the size (e.g., the voltage rating, the current rating) of electrical connectors and electrical conductors coupled to electrical connectors used with example systems can vary. In addition, example embodiments described herein can be designed for any type of voltage (e.g., alternating current (AC), direct current (DC)). For example, as stated above, reefer containers often operate at 480 volts AC and 32 amps. Example embodiments described herein can be used in new electrical connectors. In addition, some example embodiments can be used in retrofit applications of existing electrical connectors.

As defined herein, an electrical connector (or what is being tested using example embodiments), can include any one or more of a number of electrical components. Such electrical components can include, but are not limited to, a connector end of an electrical connector, an electrical cable (including any discrete electrical conductors therein), a bus bar, and a load. An electrical connector or an electrical connector end, as defined herein, can include any of these electrical components. A user may be any person that interacts, directly or indirectly, with electrical connectors and/or reefer containers. Examples of a user may include, but are not limited to, an engineer, an electrician, a deckhand, a crane operator, an instrumentation and controls technician, a mechanic, an operator, a consultant, a contractor, and a manufacturer's representative.

In the foregoing figures showing example embodiments of systems for testing electrical connectors, one or more of the components shown may be omitted, repeated, and/or substituted. Accordingly, example embodiments of systems for testing electrical connectors should not be considered limited to the specific arrangements of components shown in any of the figures. For example, features shown in one or more figures or described with respect to one embodiment can be applied to another embodiment associated with a different figure or description.

In certain example embodiments, reefer containers for which example systems for testing electrical connectors and/or the associated electrical connectors are subject to meeting certain standards, codes, and/or other requirements. For example, the National Electric Code (NEC), the National Electrical Manufacturers Association (NEMA), the International Electrotechnical Commission (IEC), and the Institute of Electrical and Electronics Engineers (IEEE) set standards as to electrical enclosures, wiring, and electrical connections. Use of example embodiments described herein meet (and/or allow a corresponding device and/or electrical enclosure to meet) such standards when required. In some (e.g., PV solar) applications, additional standards particular to that application may be met by the electrical enclosures in which example systems for testing electrical connectors are used.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three or four digit number and corresponding components in other figures have the identical last two digits.

Further, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

Example embodiments of systems for testing electrical connectors will be described more fully hereinafter with reference to the accompanying drawings, in which example embodiments of systems for testing electrical connectors are shown. Systems for testing electrical connectors may, however, be embodied in many different forms and should not be construed as limited to the example embodiments set forth herein. Rather, these example embodiments are provided so that this disclosure will be thorough and complete, and will fully convey the scope of systems for testing electrical connectors to those of ordinary skill in the art. Like, but not necessarily the same, elements (also sometimes called components) in the various figures are denoted by like reference numerals for consistency.

Terms such as "first", "second", "top", "bottom", "side", "width", "length", "radius", "distal", "proximal", "inner", and "outer" are used merely to distinguish one component (or part of a component or state of a component) from another. Such terms are not meant to denote a preference or a particular orientation, and are not meant to limit embodiments of systems for testing electrical connectors. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 illustrates a system 100 that includes an example of a typical reefer container 105 and a reefer receptacle 125 currently used in the art. In addition to the reefer container 105 and the reefer receptacle 125, FIG. 1 shows a refrigeration unit 110 disposed on or within the reefer container 105, an electrical connector 120, and an electrical cable 115 disposed therebetween. An electrical cable 115 with one or more electrical connectors 120 disposed thereon can be called an electrical cable assembly. The electrical connector 120 is coupled to the reefer receptacle 125. Electrical cables 115 described herein can have any length (e.g., 50 feet, 100 feet). The combination of the electrical connector 120, the electrical cable 115, the refrigeration unit 110, and the reefer container 105 (including any other components thereof) can be referred to as a reefer load 143.

An electrical connector 120 can have any of a number variety of configurations. For instance, in the example shown in FIG. 1, the electrical connector 120 (also more simply called a connector 120 herein) is a pin-and-sleeve type of connector with four pins. Another example configuration of an electrical connector 120 is a butt contact. For the configuration shown in FIG. 1, there are four pins (one for A-phase power, one for B-phase power, one for C-phase power, and one for ground). Other configurations can have fewer (e.g., three, two) pins or more (e.g., 50, 100) pins. The configuration of the connector 120 is configured to complement the corresponding configuration of the reefer receptacle 125 shown in FIG. 1. In some cases, to ensure that the connector 120 and the reefer receptacle 125 remain coupled to each other, interlocking features (also called coupling features) are added to the connector 120 and/or the reefer receptacle 125. Such interlocking features can provide added safety by requiring a secure mechanical connection between the reefer receptacle 125 and the connector 120 before power flows between the reefer receptacle 125 and the connector 120.

In the current art, interlocking features for the reefer receptacle 125 and the connector 120 shown in FIG. 1 provide only a mechanical interlock between the two. In other words, they do not provide any information regarding the safety of the electrical connection beyond the reefer receptacle 125 to the reefer load 143, including the connector 120 or any conductors or electrical equipment downstream of the connector 120. For example, because the connector 120 and electrical cable 115 remain attached to the reefer receptacle 125 of the reefer container 105 while the reefer container 105 is transported and stored, it is common for the connector 120 and/or the power cord 115 to become damaged.

As shown in FIG. 1, the reefer receptacle 125 and corresponding reefer load 143 can be used in any of a number of applications. Examples of such applications can include, but are not limited to, port racks, on-ship racks, trucks, trains (rail transport), and distribution centers. Regardless of the application in which reefer receptacles 125 and the reefer load 143 are used, failure to realize an electrical problem in a timely manner can lead to loss of product (e.g., from spoilage) within the reefer container 105 and/or increased risk of harm to personnel and/or equipment.

Figure 2A:
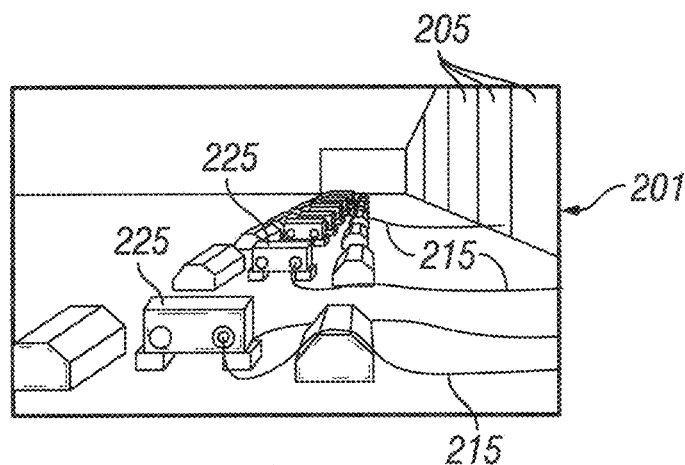
FIGS. 2A-2C show ways that reefer containers are stored during transit.
Figure 2B:
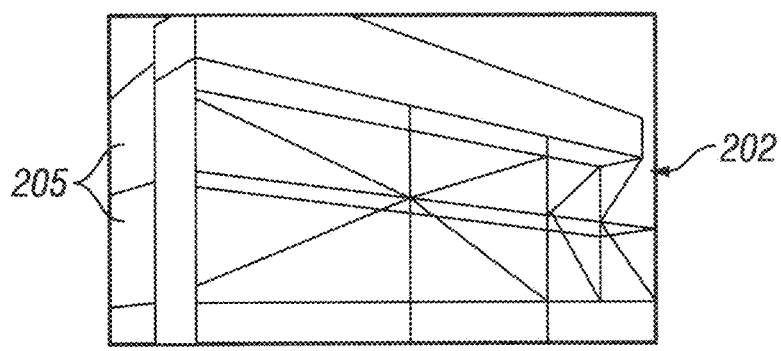

For example, FIGS. 2A and 2B show some other ways that reefer containers 205 are stored during transit. In FIG. 2A, a number of reefer receptacles 225 to which reefer containers 205 can be coupled using electrical cables 215 are laid out in a horizontal reefer runway 201, where reefer containers 205 and reefer receptacles 225 are placed adjacent to each other on the ground. The cables 215 for the reefer containers are laid on the open ground, exposed to any elements and equipment in the area. In FIG. 2B, a number of reefer containers 205 are stored in a reefer rack 202, where the reefer containers 205 are stacked vertically in a more dense arrangement and are located closer to the reefer receptacles (hidden from view).

Figure 2C:
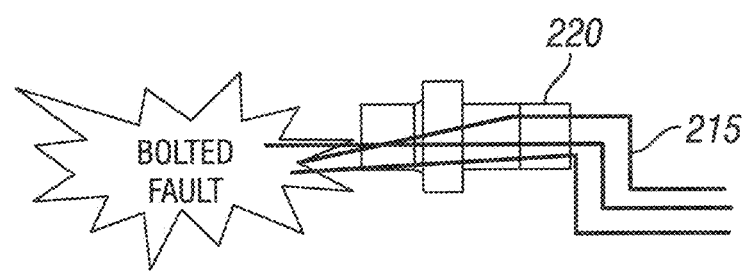

Damage to the connector 220 and/or the electrical cable 215 can produce an unsafe condition, such as a bolted fault (as illustrated in FIG. 2C) or ground fault, when a damaged connector 220 is connected to a reefer receptacle 225 and energized. Unsafe electrical conditions can also arise downstream of the electrical cable 215 toward the rest of the reefer load, such as at the compressor (load) or other electrical components of the refrigeration system. Such unsafe conditions can be exacerbated in situations where reefer containers 205 are stored in racks (e.g., reefer rack 202) so that the reefer containers 205 are located relatively close to the main incoming electrical source (i.e., the reefer receptacles). In such a case, a higher short circuit current can occur.

Example embodiments offer an improved reefer receptacle (e.g., reefer receptacle 125) that can alert users to unsafe electrical conditions in the reefer load (e.g., reefer load 143), such as the connector (e.g., connector 120), electrical cable (e.g., electrical cable 115), the refrigeration unit (e.g., refrigeration unit 110), and/or any other electrical components of the reefer load. Example embodiments can also enhance the practice associated with interlocking features. Specifically, example embodiments can prevent the reefer receptacle from being energized when an unsafe electrical condition is detected.

Figure 3B:
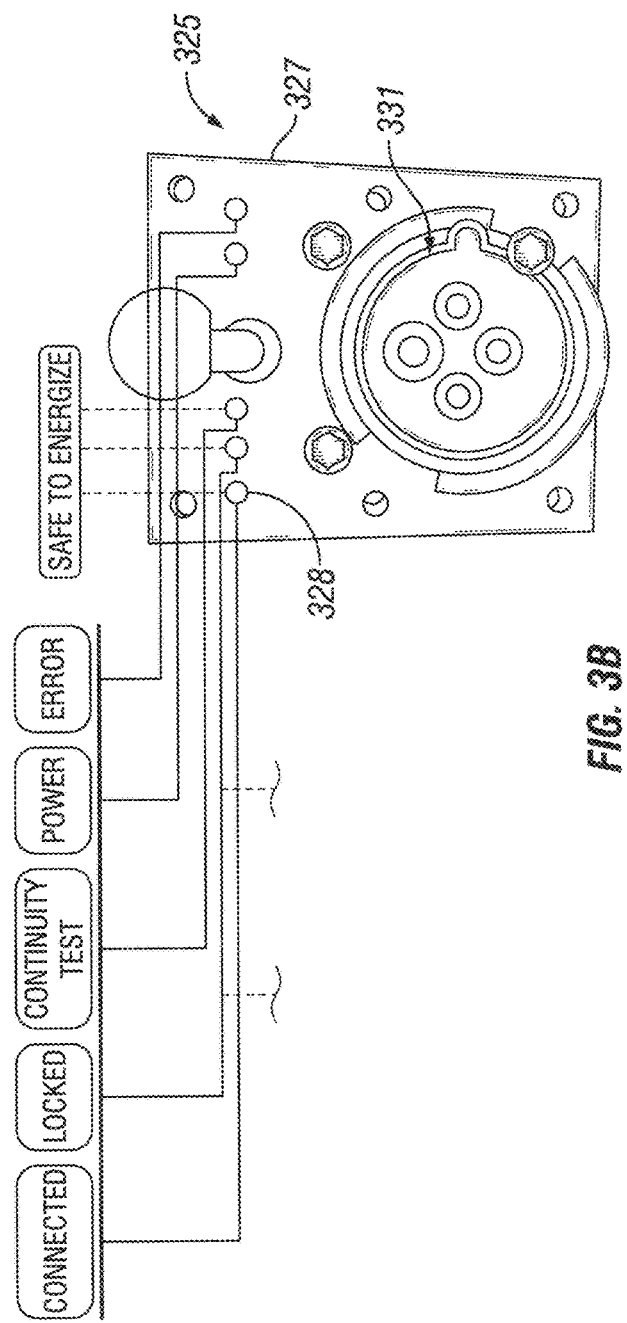
FIGS. 3A-3C illustrate a connection assembly in accordance with certain example embodiments.
Figure 3C:
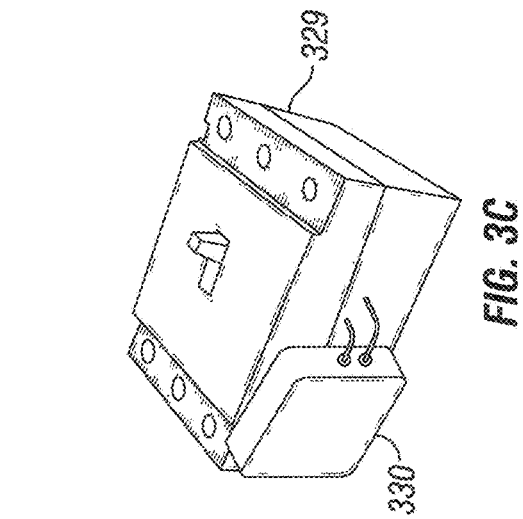
Figure 3A:
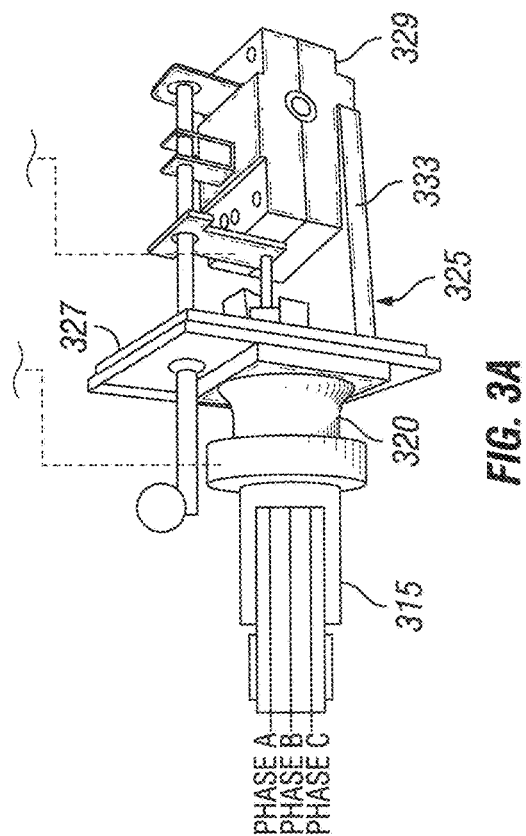

FIGS. 3A-3C show various views of a connection assembly 303 in accordance with certain example embodiments. The connection assembly 303 of FIG. 3A shows an electrical connector 320 coupled to an example reefer receptacle 325. The reefer receptacle 325 of FIGS. 3A-3C include a faceplate 327, a molded case circuit breaker 329 mounted on a tray 333 that extends rear-ward from the faceplate 327, an indicating panel 328 on the front of the faceplate 327, the connector 331 disposed in the faceplate 327, and a controller 330. The connector 331 of the reefer receptacle 325 has features (e.g., coupling features, interlocking features) that complement the corresponding features of the connector 320.

The controller 330 can perform any of a number of functions. For example, the controller 330 can perform safety testing of the electrical connections, conductors, and load before closing the circuit breaker 329 and allowing power to flow therethrough. The controller 330 is shown in FIG. 3C mounted to the exterior of the circuit breaker 329. However, in alternate embodiments, the controller 330 can be disposed in any of a number of other locations relative to the reefer receptacle 325, including but not limited to within the circuit breaker 329.

As described further in the figures that follow, the controller 330 provides the ability to test the electrical connections and conductors between the reefer receptacle 325, the connector 320, the electrical cable 315, and the electrical components downstream of the electrical cable 315 towards and including the load to ensure there are no faults or other unsafe electrical conditions prior to closing the breaker 329 and energizing the circuit. The controller 330 can also control the operation of the circuit breaker 329 such that if an unsafe condition is detected, the circuit breaker 329 cannot be closed and the circuit cannot be energized. The results of the tests performed by the controller 330 can be communicated to a user in one or more of a number of ways.

For example, the indicating panel 328 disposed on the faceplate 327 of the reefer receptacle 325 in FIG. 3B can communicate the status of the system as determined by the controller 330. In such a case, the indicating panel 328 can indicate that the connector 320 is properly connected to the reefer receptacle 325. As another example, the indicating panel 328 can indicate that there are no faults detected in the circuit. As yet another example, the indicating panel 328 can indicate that the breaker 329 is closed and power is being delivered to the circuit. In other embodiments different arrangements of the indicating panel 328, including visual and audible capability, can be implemented to communicate the results of the tests performed by the controller 330.

The indicating panel 328 of the example reefer receptacle 325 can include any of a number of components and/or have any of a number of forms. For example, as shown in FIG. 3, the indicating panel 328 can include a number of light indicators disposed on the faceplate 327 of the reefer receptacle 325. As another example, the indicating panel 328 can be an interactive digital display disposed on the faceplate 327 of the reefer receptacle 325. In other words, the indicating panel 328 can be, or be a part of, the application interface described below with respect to FIG. 17. In certain example embodiments, the controller 330 can communicate with a user, a network manager, a central monitoring system, another controller 330 for another reefer receptacle, and/or any other system that can use data from the controller 330.

Those of ordinary skill in this field will recognize that the controller 330 described in FIGS. 3A-3C can be applied to other types of enclosures in both hazardous and non-hazardous environments. For example, instead of the previously described circuit breaker 329, the reefer receptacle 325 can include a manual switching device (also called an electrical interlock), such as a relay, a starter, a contactor, a solenoid, and/or any other type of switch. As with the foregoing example, the alternative switching device can include the controller 330 to perform testing on the connector 320 and other components before the manual switch is actuated and the reefer receptacle 325 is energized.

In certain example embodiments, the controller 330 includes a hardware processor. Alternatively, the controller 330 does not include a hardware processor. In such a case, the controller 330 can include, as an example, one or more field programmable gate arrays (FPGA). Using FPGAs and/or other similar devices known in the art allows the controller 330 (or portions thereof) to be programmable and function according to certain logic rules and thresholds without the use of a hardware processor. Alternatively, FPGAs and/or similar devices can be used in conjunction with one or more hardware processors.

Figure 4:
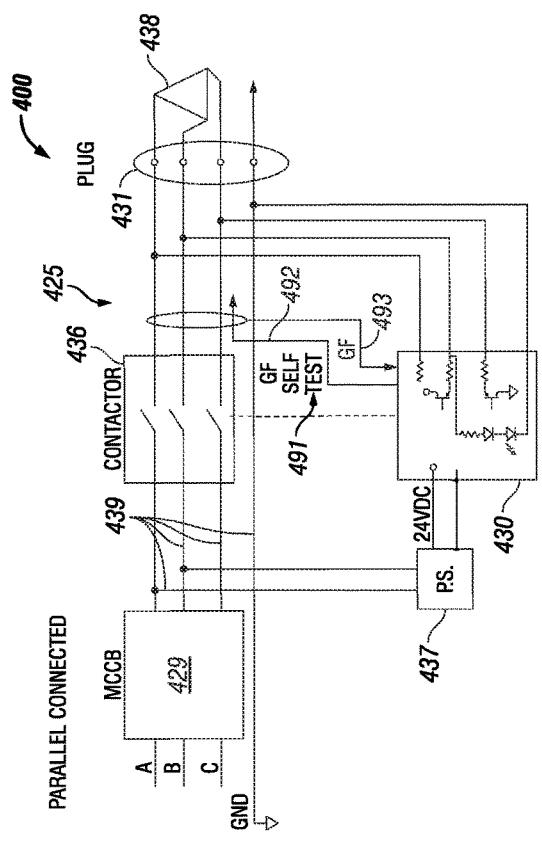
FIG. 4 shows a block diagram of a reefer receptacle in accordance with certain example embodiments.

FIG. 4 shows a block diagram of a system 400 that includes a reefer receptacle 425 in accordance with certain example embodiments. The reefer receptacle 425 of FIG. 4 includes a controller 430, a contactor 436 (or, more generally, an electrical interlock 436, as described above), a circuit breaker 429 (also more simply called a breaker 429 herein), a power source 437, and a connector 431. All of these components of the reefer receptacle 425 are electrically coupled to each other using electrical conductors 439. The controller 430 and the contactor 436 in FIG. 4 are each connected in series with the circuit breaker 429 and the connector 431, and in parallel with each other.

The controller 430 can receive power for performing testing operations via a power source 437. In such a case, the power source 437 creates (using, for example, transformers, inverters, converters, diode bridges) a level and type of power that is used by the controller 430 from the power flowing between the breaker 429 and the contactor 436. For example, the power source 437 can create 24 V DC power. In certain example embodiments, the power source 437 creates power that can be considered part of a Class 2 circuit during the pre-energization test, which means that installation and maintenance of the controller 430 can be performed by any individual, as opposed to a Class 1 circuit, which can only be installed or maintained by a licensed electrician. Further, Class 2 circuits have substantially lower risk of electrical shock to a user who comes into contact with the controller 430 or other part of the Class 2 circuit (including the downstream connector, power cord, and load) during the pre-energization test.

The controller 430 performs testing by transmitting signals onto each of the four electrical conductors 439 (three discrete phase conductors and a ground conductor) of the connector 431 that connects via one or more electrical conductors 439 to the reefer load 438. The controller 430 can also include one or more components for evaluating the electrical and/or mechanical integrity of the reefer receptacle 425 and associated equipment. For example, the controller 430 can include a sensing coil for ground fault testing. As another example, the controller 430 can include a temperature sensor for detecting temperature increases that may indicate an unsafe condition. If the controller 430 detects an unsafe electrical condition via any of the tests that are performed, the controller 430 can lock the contactor 436 so that power cannot be delivered to the plug 431. In the implementation shown in FIG. 4, the contactor 436 must be rated to handle the voltage and current conducted from the breaker 429 to the connector 431 once the breaker 429 and contactor 436 are closed.

The controller 430 of FIG. 4 can also include a self-test circuit 491 that is used to check for one or more adverse conditions (e.g., ground fault) in the system 400. The self-test circuit 491 can include one or more of a number of features and/or components. For example, as shown in FIG. 4, ground fault testing can be performed with the self-test circuit 491 and can include an electrical conductor 492 that is used to inject test power (e.g., current) into a part of the system 400. Other types of faults, such as bolted faults, can be tested by injecting test signals on the conductors (in this case, with the A, B, and C phase electrical conductors 439) on the load side of the contactor 436 between the contactor 436 and the plug 431. As another example, as shown in FIG. 4, the self-test circuit 491 can include another electrical conductor 493 that is used to receive signals (e.g., current, voltage) from a part of the system 400 (in this case, in the A, B, and C phase electrical conductors 439 on the load side of the contactor 436 between the contactor 436 and the plug 431.

Figure 5:
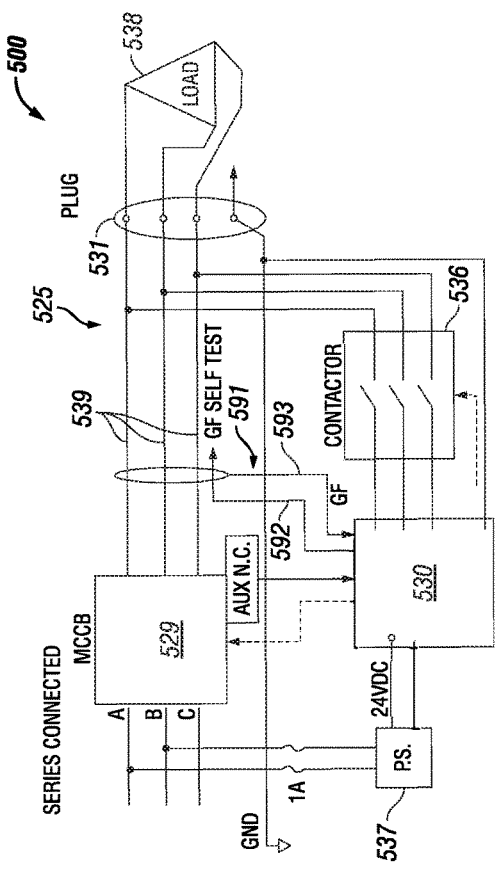
FIG. 5 shows a block diagram of another reefer receptacle in accordance with certain example embodiments.

FIG. 5 shows a block diagram of a system 500 that includes another reefer receptacle 525 in accordance with certain example embodiments. The reefer receptacle 525 of FIG. 5 includes a controller 530, a contactor 536 (or, more generally, an electrical interlock 536, as described above), a circuit breaker 529, a power source 537, and a connector 531. All of these components of the reefer receptacle 525 are electrically coupled to each other using electrical conductors 539. The controller 530 and the contactor 536 in FIG. 5 are connected in series with each other and in parallel with the circuit breaker 529.

In this case, the controller 530 receives power (e.g., 24 VDC) from the power source 537 and transmits test signals on four electrical conductors 539 (three discrete phase conductors and a ground wire) to the contactor 536. The connector 531 is coupled via electrical conductors 539 to the contactor 536 on one side and to the reefer load 538 on the other side. As with the controller 430 of FIG. 4, the controller 530 of FIG. 5 can also include one or more components for evaluating the electrical and/or mechanical integrity of the reefer receptacle 525 and associated equipment. For example, the controller 530 can include a sensing coil for performing ground fault testing. As another example, the controller 530 can include a temperature sensor for detecting temperature increases that may indicate an unsafe condition.

The controller 530 can be coupled to the breaker 529 and prevent the breaker 529 from closing if an unsafe condition is detected. The example embodiment shown in FIG. 5 offers advantages over the example embodiment shown in FIG. 4 in that the contactor 536 in FIG. 5 is not required to be as robust as the contactor 436 in FIG. 4 because contactor 536 is not conducting the full current to the connector 531. The contactor 536 also provides electrical isolation of the controller 530 from the high voltage of the electrical conductors 539 when they are energized, so low voltage detection circuitry can be used. The controller 530 of FIG. 5 can also include a test-test circuit 591, which can be substantially similar to the test-test circuit 491 described above with respect to FIG. 4.

Figure 6:
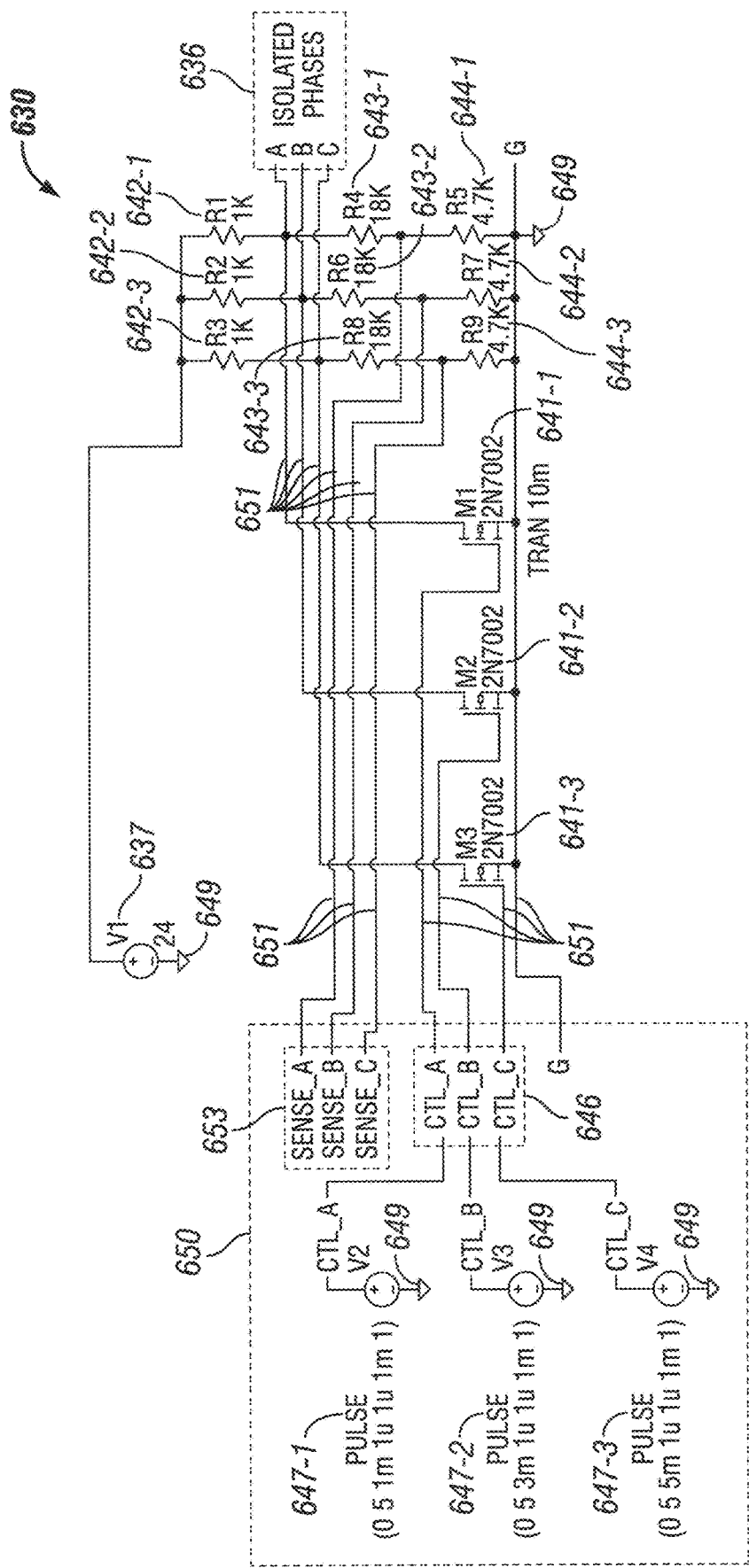
FIG. 6 shows a circuit diagram of a controller for a reefer receptacle in accordance with certain example embodiments.

As discussed above, the controller (e.g., controller 430, controller 530) can have any of a number of configurations using any of a number of components. FIG. 6 shows an example of one such configuration of a controller. Specifically, FIG. 6 shows a circuit diagram of a controller 630 for a reefer receptacle (e.g., refer receptacle 525) in accordance with certain example embodiments.

In this case, the controller 630 includes a number of resistors (e.g., resistors 642, resistors 643, resistors 644), a number of switches 641, and a hardware processor 650 that are connected to each other using electrical conductors 651. Each resistor in FIG. 6 is actually three substantially identical resistors, one for each phase of power. For example, resistor 642 includes resistor 642-1 for one phase of power, resistor 642-2 for a second phase of power, and resistor 642-3 for a third phase of power. Similarly, the switch 641 in FIG. 6 is actually three substantially identical switches (switch 641-1, switch 641-2, and switch 641-3), one for each phase of power.

Resistor 642 of the controller 630 in FIG. 6 forms a resistive divider that receives a voltage (e.g., 24 VDC) from a power source 637. The resistor 642 can "pull up" the voltage received from the power source 637 to achieve a higher voltage level. In certain example embodiments, the level of voltage of the power, after passing through resistor 642, is within acceptable limits for a Class 2 circuit. In some cases, the level of voltage of the power approaches, without reaching, the limit for Class 2 circuits. In this way, a user other than a licensed electrician can install and/or maintain the controller 630 and the downstream circuitry (e.g., the reefer load 538, including any portions thereof, such as the connector 531), the risk of electric shock with respect to the power flowing through the controller 630 is greatly reduced, and the determinations made by the controller 630 can be more definitively made.

The hardware processor 650 can execute software, algorithms, and/or firmware in accordance with one or more example embodiments. Specifically, the hardware processor 650 can execute software. The hardware processor 650 can be an integrated circuit, a central processing unit, a multi-core processing chip, SoC, a multi-chip module including multiple multi-core processing chips, or other hardware processor in one or more example embodiments. The hardware processor 650 is known by other names, including but not limited to a computer processor, a microprocessor, and a multi-core processor When the controller 630 includes a hardware processor 650, the controller 630 can also include one or more of a number of other hardware components, including but not limited to a control engine, a communication module, a real-time clock, an energy metering module, a power module, a storage repository, a memory, a transceiver, an application interface, and, optionally, a security module. An example of a controller and its various components is shown below with respect to FIG. 17. The controller 630 can correspond to a computer system as described below with regard to FIG. 18.

If any of the three phases is shorted to ground, it will easily be determined by the controller 630 in the voltage measured at the sensing terminals 653 (also called sensing pins 653) of the hardware processor 650. The switches 641 in this case are MOSFETs, but can be any other type of transistor or any other type of switch (e.g., bipole switch, contacts of a relay). The switches 641 in this case are controlled by pulse generators 647 (one for each phase) of the hardware processor 650 through the control terminals 646 (also called control pins 646). The hardware processor 650 sequentially operate each switch 641 to short a phase to ground 649. If any two phases are shorted to each other, the hardware processor 650 will be able to determine this at the sensing terminals 653 because the grounding will be apparent on more than the single shorted phase.

In the configuration shown in FIG. 6, resistor 642 creates a RC time constant with a capacitive load. As a result, the time rise of the signal on each phase, as measured by the hardware processor 650 at the sensing terminals 653, can be used to calculate the capacitance of the load. A LR time constant also exists for an inductive load, and the fall time of the signal measured by the hardware processor 650 at the sensing terminals 653 can be used to calculate the inductance of the load. Any significant inductance or capacitance indicates that the cable (e.g., cable 315) is not shorted, and so energy can be applied.

Figure 7:
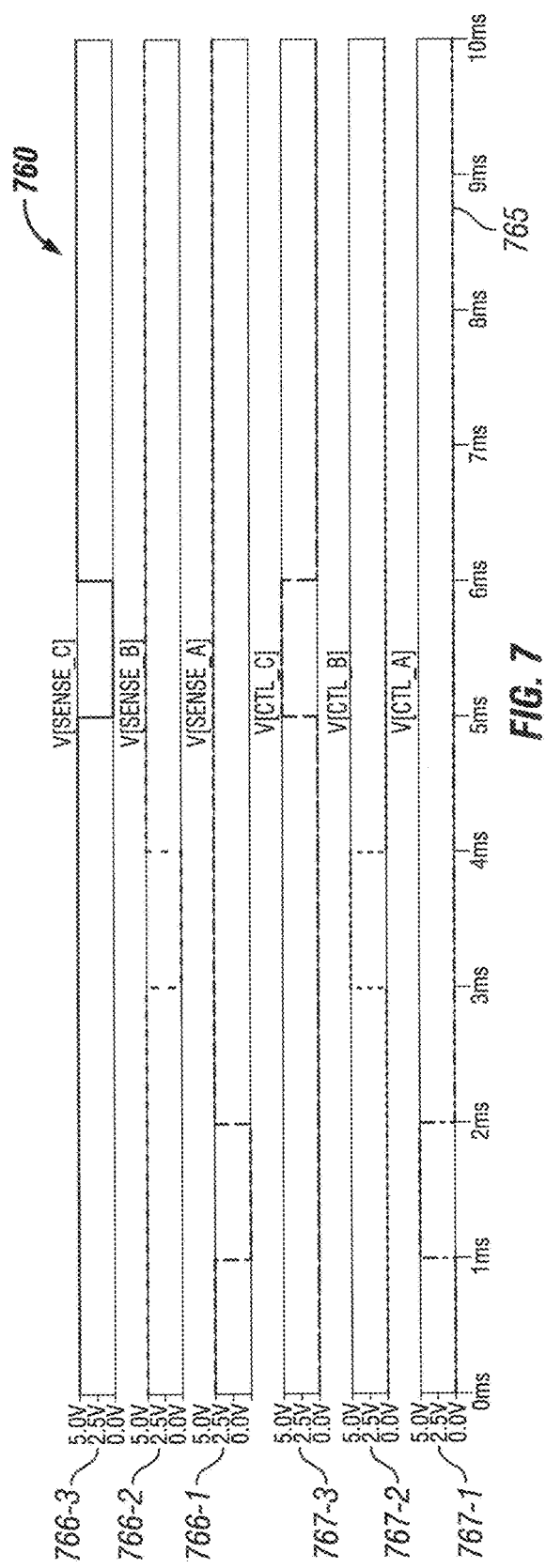
Figure 8:
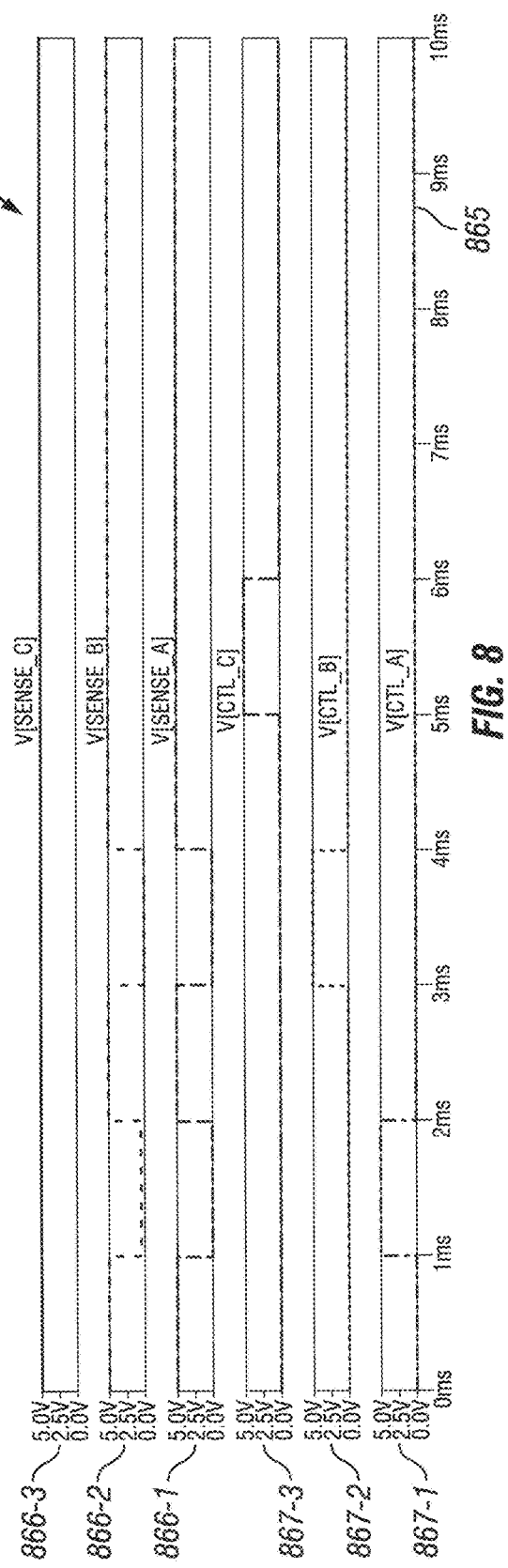
Figure 10B:
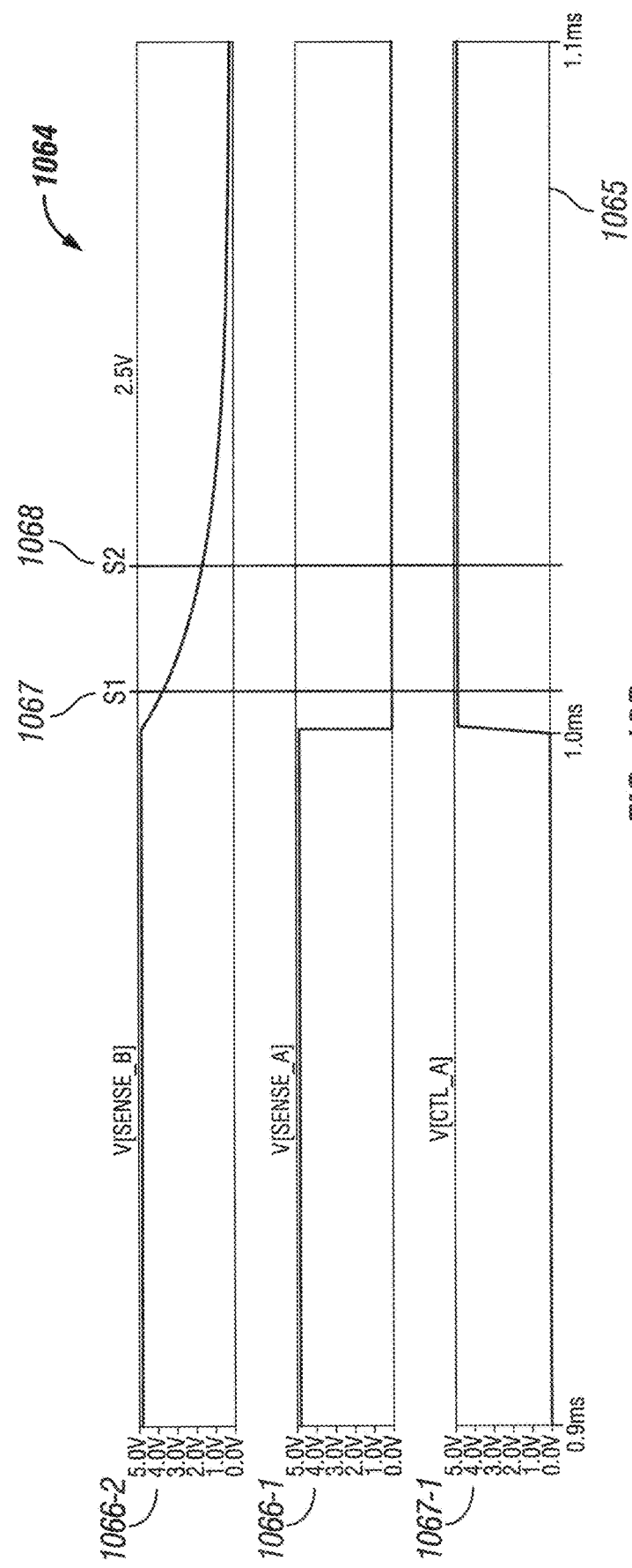

FIGS. 7-10B show examples of how the controller 630 of FIG. 6 can be used to detect various faults in the electrical cable and/or connector that feeds power to a reefer container. FIG. 7 shows a graph 760 where the controller 630 determines that there is no fault. FIG. 8 shows a graph 861 where the controller 630 determines that there is a phase-to-phase short circuit. FIG. 9 shows a graph 962 where the controller 630 determines that there is a phase-to-ground short circuit. FIGS. 10A and 10B show graphs (graph 1063 and graph 1064) where the controller 630 determines that there is a phase-to-phase inductance.

Referring to FIGS. 1-10B, the graph 760 of FIG. 7 shows various voltages over time 765. The voltages, from top to bottom, are the voltage 766-3 for sensing terminal 653-3, the voltage 766-2 for sensing terminal 653-2, the voltage 766-1 for sensing terminal 653-1, the voltage 767-3 for control terminal 646-3, the voltage 767-2 for control terminal 646-2, and the voltage 767-1 for control terminal 646-1. In this case, there are no faults, so conditions are normal.

As discussed above, the three phases of the line cord are pulled high (e.g., 24 VDC) through pull-up resistors 642-1, 642-2, and 642-3. During operation/testing, each phase is individually pulled low by the hardware processor 650 using a digital control signal sent through the control terminals 646 and utilizing (operating) a corresponding switch 641. Sense signals for each phase, received at the sensing terminals 653, are derived using voltage dividers (resistor 643/ resistor 644 for each respective phase) to translate the voltages to a range of 0V-5V, which are plotted in FIG. 7. These signals could be considered digital or analog depending on the fault conditions being detected, and whether the signals are fed back to analog or digital sense pins on the hardware processor 650.

The waveforms in the graph 760 if FIG. 7 show that as each of the control terminals 646 is individually and sequentially driven high (5V in this case), the corresponding switch 641 is turned on, during which time it pulls the associated line phase low. Since the lines are isolated (no phase-to-phase short circuit), and no fault conditions exist, only one phase goes low at a time. In other words, only the phase actively being pulled low by the corresponding switch 641 is low (0V). The other two phases remain high (5V). As the phases are individually pulled low, the sense lines for all phases are checked at the sensing terminals 653 by the hardware processor 650 to make sure only the single intended phase goes low at a time. If this is true (as is shown in this case), then the no-fault condition is confirmed by the hardware processor 650.

The graph 861 of FIG. 8 shows various voltages over time 865. The voltages, from top to bottom, are the voltage 866-3 for sensing terminal 653-3, the voltage 866-2 for sensing terminal 653-2, the voltage 866-1 for sensing terminal 653-1, the voltage 867-3 for control terminal 646-3, the voltage 867-2 for control terminal 646-2, and the voltage 867-1 for control terminal 646-1. In this case, there is a short circuit (fault) between phases A and B. The control signals applied by the hardware processor 650 through the control terminals 646 in the operation captured by the graph 861 of FIG. 8 are in the same sequence as described above with respect to FIG. 7.

Here, the sensed signals returning to the hardware processor 650 at the sensing terminals 653 indicate there is a fault. This is indicated by the fact that any time either control terminal 646-1 or control terminal 646-2 is driven high (activated), the sense signals, read by the hardware processor 650 at sensing terminal 653-1 and sensing terminal 653-2, both go low together. Therefore, any time either control terminal 646-1 or control terminal 646-2 is activated, and the sense signals are read back, the hardware processor 650 will note that the sense signals, measured at both sensing terminal 653-1 and sensing terminal 653-2 by the hardware processor 650, are in the low state, indicating a fault condition.

The graph 962 of FIG. 9 shows various voltages over time 965. The voltages, from top to bottom, are the voltage 966-3 for sensing terminal 653-3, the voltage 966-2 for sensing terminal 653-2, the voltage 966-1 for sensing terminal 653-1, the voltage 967-3 for control terminal 646-3, the voltage 967-2 for control terminal 646-2, and the voltage 967-1 for control terminal 646-1. In this case, there is a ground fault of phase A to ground. Again, the control signals applied by the hardware processor 650 through the control terminals 646 in the operation captured by the graph 962 of FIG. 9 are in the same sequence as described above with respect to FIGS. 7 and 8.

Here, the ground fault condition manifests itself in the fact that phase A is pulled low, as measured by the hardware processor 650 at sensing terminal 653-1, at all times, regardless of the state of any of the control signals, as measured at the control terminals 646. This includes the times (e.g., between 2 ms and 3 ms, after 6 ms) when no control signal is active. If the sense signals, as measured by the hardware processor 650 at sensing terminals 653, are read during the time when all control signals are inactive, then a low on any phase indicates a fault between the corresponding phase and ground. In theory, a high impedance ground fault can also be sensed if an A/D conversion is performed on the sensed signal. In certain example embodiments, a voltage divider formula can be used by the hardware processor 650 to determine the exact impedance of a ground fault.

The graph 1063 of FIG. 10A and the graph 1064 of FIG. 10B show various voltages over time 1065. The voltages, from top to bottom, are the voltage 1066-3 for sensing terminal 653-3, the voltage 1066-2 for sensing terminal 653-2, the voltage 1066-1 for sensing terminal 653-1, the voltage 1067-3 for control terminal 646-3, the voltage 1067-2 for control terminal 646-2, and the voltage 1067-1 for control terminal 646-1. The control signals applied by the hardware processor 650 through the control terminals 646 in the operation captured by the graph 1063 of FIG. 10A and the graph 1064 of FIG. 10B are in the same sequence as described above with respect to FIGS. 7-9.

In this case, there is an inductance (e.g., from a motor) between phases. To simplify the model and associated waveforms, only a single inductor is shown between phase A and B. In reality, a motor or other similar source of inductance would likely present inductances between all phases. However, this simplified example uses the same principal of operation.

This is the most interesting/complex of the possible conditions, and is not considered a fault. The issue with a motor load is that (at least for dc, low frequency, or slow transient stimulus) it presents a low impedance between phases that appears very similar to a short circuit. With the exception of the timing near switching events, the waveforms in this example are the same as in the example of FIG. 8 above. The information needed to distinguish the two is found in the graph 1064 of FIG. 10B, which zooms in on the voltages measured by the hardware processor 650 at control terminal 646-2, control terminal 646-1, and sensing terminal 653-1. In addition, there are some inductive voltage spikes on the sense signals, identified in circled areas 1065 in the graph 1063 of FIG. 10A, that indicate the need for diode clamps (low voltage Schottky diodes) or some similar correction component to the digital supply voltage.

Graph 1064 of FIG. 10B shows the time in and around the transition of control signal 1067-1, measured at control terminal 646-1 by the hardware processor 650, from low to high (around 1 ms). The sense signal 1066-1, measured by the hardware processor 650 at sensing terminal 653-1, goes low immediately as expected. By contrast, the sense signal 1066-2, measured by the hardware processor 650 at sensing terminal 653-1, is "slow" to react, taking almost 0.05 ms to reach 0V. If the sense signal 1066-2 is checked (e.g., against a 2.5V threshold) immediately after the switching event (at time 1067), it is still considered "high". If a small amount of time is allowed to pass (at time 1068) before checking the sense signal 1066-2, the sense signal 1066-2 indicates a "low" condition. In essence, what is happening is that the resistance associated with phase A and B, in series with the motor inductance, is creating a first order L-R time constant. Another way to look at this is that the combined L-R is creating a single pole low-pass filter topology that is "slow" to react to the fast transition of the event.

However it is viewed, this time constant provides the opportunity to distinguish the event from a "hard" short circuit. If the sensed signal 1066-1 is checked immediately after the switching event, the motor inductance presents an open circuit between phases, and appears the same as the no fault condition. If the sensed signal 1066-1 is checked after the transient has had time to settle, the motor presents a short circuit just like the phase-to-phase short circuit shown in FIG. 8. It is the "check" at time 1067 that allows differentiation of a short circuit condition as opposed to a connected motor. Finally, if a fast A/D converter is used to digitize this sensed waveform, the motor inductance can be calculated if it is of interest. Presumably, other complex impedances (e.g., capacitance, combinations of RLC) could be determined as well (at least between phases, but not ground).

Figure 11:
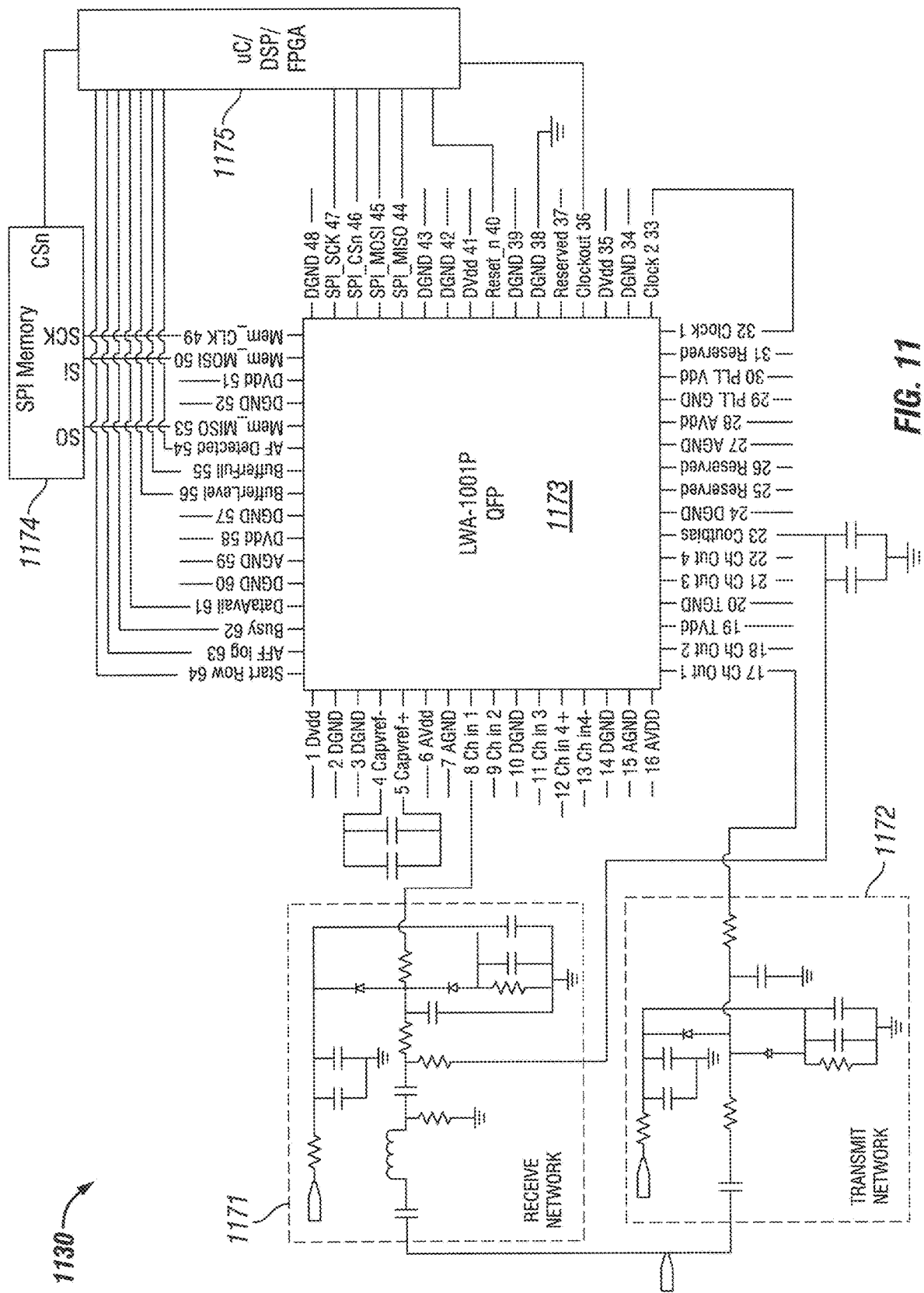
FIG. 11 shows a circuit diagram of another controller for a reefer receptacle in accordance with certain example embodiments.

FIG. 11 shows a circuit diagram of another controller 1130 for a reefer receptacle in accordance with certain example embodiments. The controller 1130 uses spread-spectrum time-domain reflectometry (SSTDR), here time domain "pulses" are sent through electrical conductors (e.g., electrical conductors 539), and their reflections are analyzed. The controller 1130 using SSTDR can have any of a number of components and/or configurations. In this case, the controller includes integrated circuit 1173 (IC 1173), memory 1174, a logic array 1175, a receive network 1171, and a transmit network 1172.

A controller 1130 using SSTDR can be an integrated circuit (e.g., IC 1173), a number of discrete components (as with the receive network 1171 and the transmit network 1172), or any combination thereof. As stated above, when the controller 1130 includes a hardware processor, the controller 1130 can also include one or more of a number of other hardware components, including but not limited to a control engine, a communication module, a real-time clock, an energy metering module, a power module, a storage repository, a memory, a transceiver, an application interface, and, optionally, a security module. The controller 1130 can correspond to a computer system as described below with regard to FIG. 18.

A controller 1130 that uses SSTDR realizes a number of advantages over other more conventional methods of determining potentially adverse electrical conditions in a connector (e.g., connector 320), an electrical cable (e.g., electrical cable 315), and/or any other relevant electrical device or component. For example, by using a wideband pulse, the energy is spread over a wide frequency range. As a result, the instantaneous voltage is very small, which allows SSTDR systems to run real-time when voltages are present.

Figure 12:
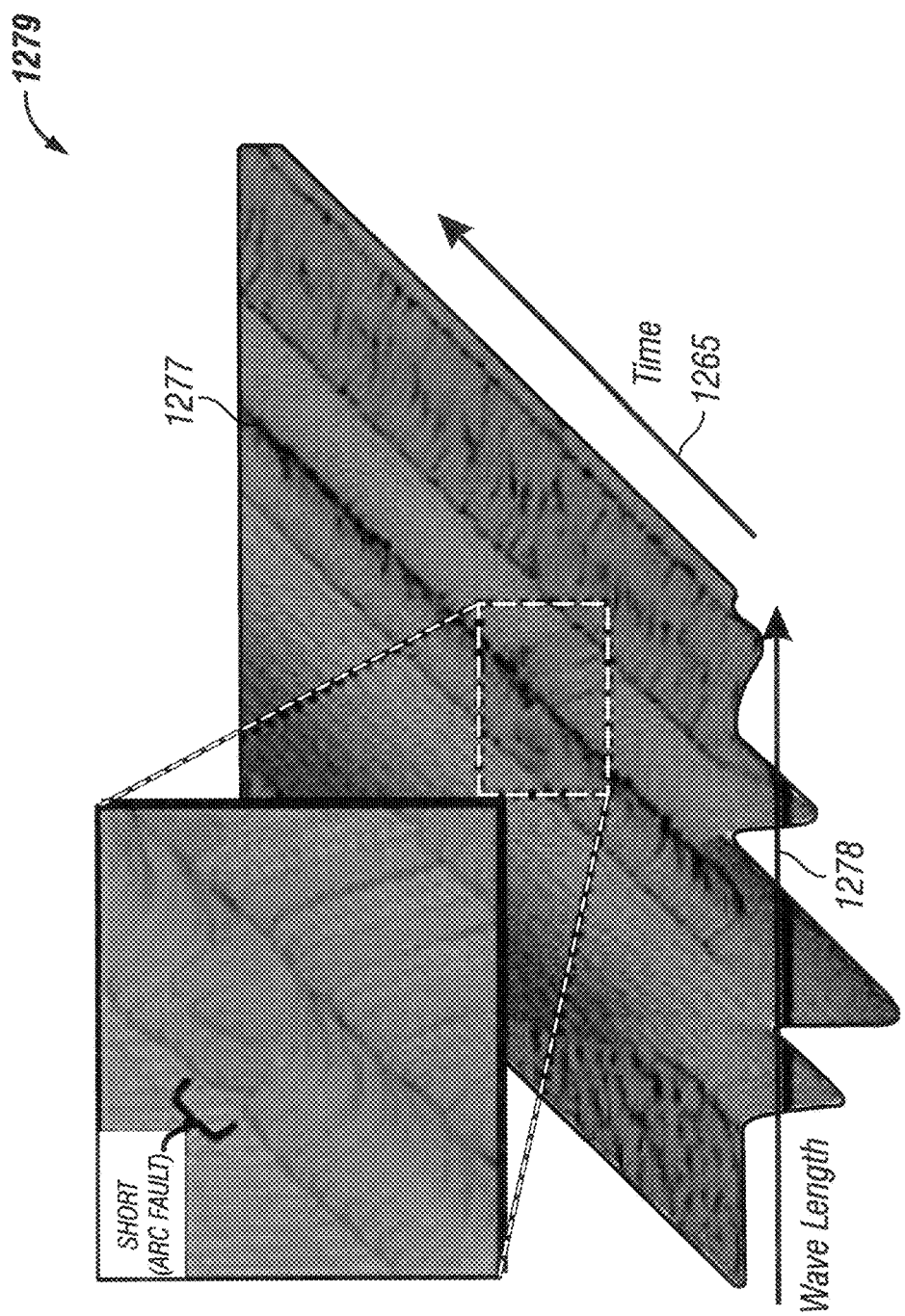
FIG. 12 shows a graphical example of how a controller can be used to detect various faults in the electrical cable and/or connector that feeds power to a reefer container.

Further, because of the higher frequencies (e.g., up to 100 MHz), the pulse durations are extremely short, and so analysis can be performed in much less time (e.g., milliseconds). In addition, since the pulses are analyzed through a matched filter/correlation when received, the pulses can be stacked on top of each other (as shown in FIG. 12 below) to give continuous, real-time feedback. Further, using SSTDR allows the controller 1130 to not only determine that a fault exists, but also be able to locate, with accuracy, the location of the fault. For example, if there is a fault in an electrical cable (e.g., electrical cable 315) that is 70 feet long, the controller 1130 can tell a user precisely where along the length of the electrical cable the fault is located.

FIG. 12 shows a graphical example of how the controller 1130 of FIG. 11 can be used to detect various faults in the electrical cable and/or connector that feeds power to a reefer container. The graph 1279 of FIG. 12 is a three-dimensional display showing a plot of pulses 1277 measured both in time 1265 and wire length 1278 (e.g., of an electrical cable).

Figure 13:
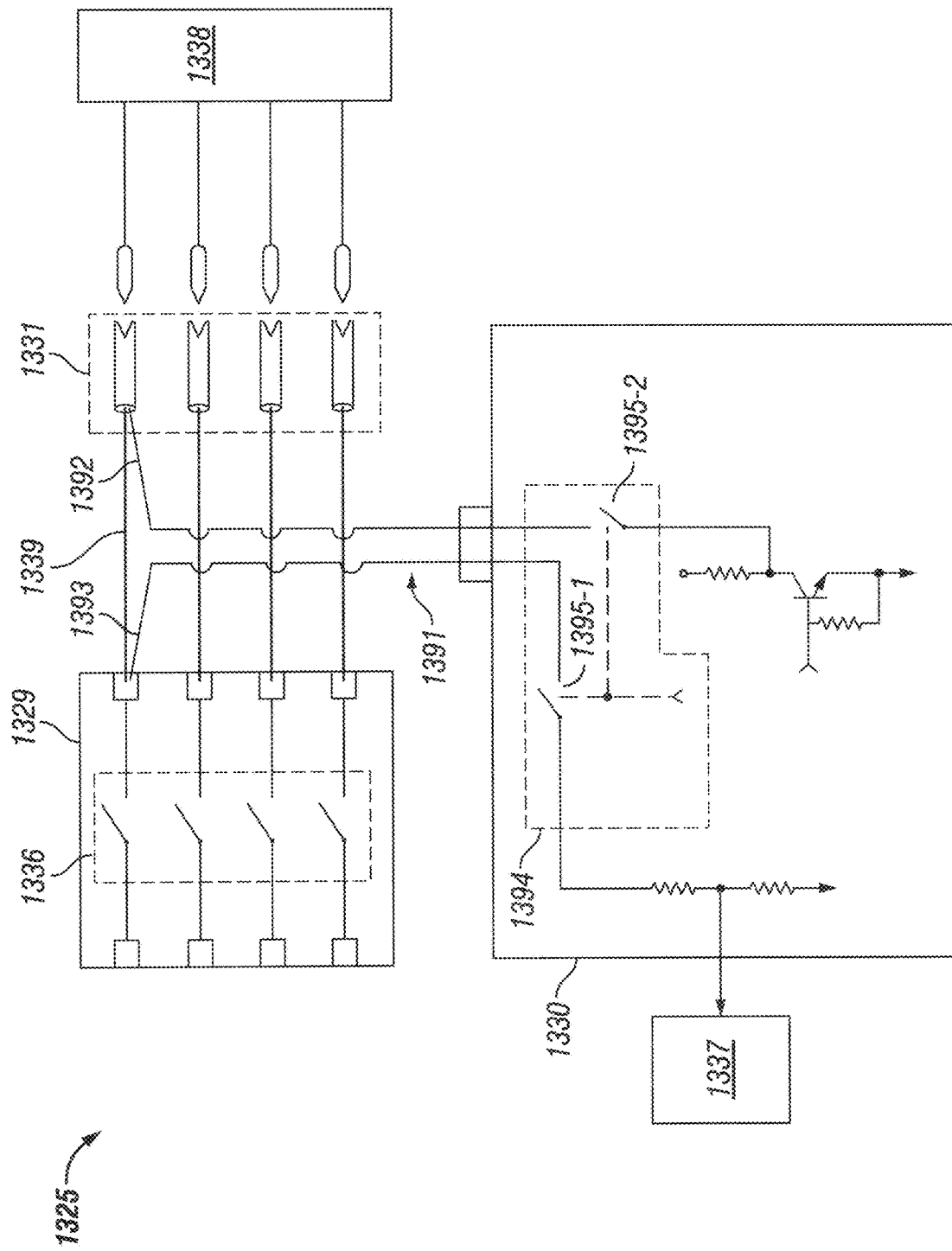
FIG. 13 shows a block diagram of another reefer receptacle in accordance with certain example embodiments.

FIG. 13 shows a block diagram of a system 1300 that includes another reefer receptacle 1325 in accordance with certain example embodiments. The reefer receptacle 1325 of FIG. 13 is substantially the same as the reefer receptacle 425 of FIG. 4 and the reefer receptacle 525 of FIG. 5, except as described below. Specifically, referring to FIGS. 1-13, the contactor 1336 (or, more generally, an electrical interlock 1336, as described above) in this case is integrated with the breaker 1329. Further, the self-test circuit 1391 includes one or more switches 1395 (in this case, switch 1395-1 and switch 1395-2) to control when signals are sent and/or received over conductor 1392 and conductor 1393.

The switches 1395 can be part of a control device 1394. Examples of a control device 1394 can include, but are not limited to, a relay or an opto-coupler. If there are multiple switches 1395, then each switch 1395 can be controlled individually or in concert with one or more other switches 1395. In this case, switch 1395-2 can be used to control when the controller 1330 injects test power into the system 1300, and switch 1395-1 can be used to control when the controller 1330 receives signals from the system 1300.

Further, electrical conductor 1392 and/or electrical conductor 1393 can be electrically coupled to the system 1300 in any of a number of ways. For example, electrical conductor 1392 and/or electrical conductor 1393 can be hardwired. As another example, electrical conductor 1392 and/or electrical conductor 1393 can include a connector (e.g., a ferrule, a sleeve) that can easily be connected and/or disconnected from one or more portions of the system 1300. In this case, electrical conductor 1392 and electrical conductor 1393 include a power conductor harness with spliced pigtails (utilizing two-conductor ferrules) in order to reliably inject and sense at two different locations (ends) of an electrical conductor 1339, between the breaker 1329 and the plug 1331. In such a case, there is only one ferruled conductor terminated at the plug 1331 and lugs of the breaker 1329, thus complying with applicable codes under the NEC.

Figure 14:
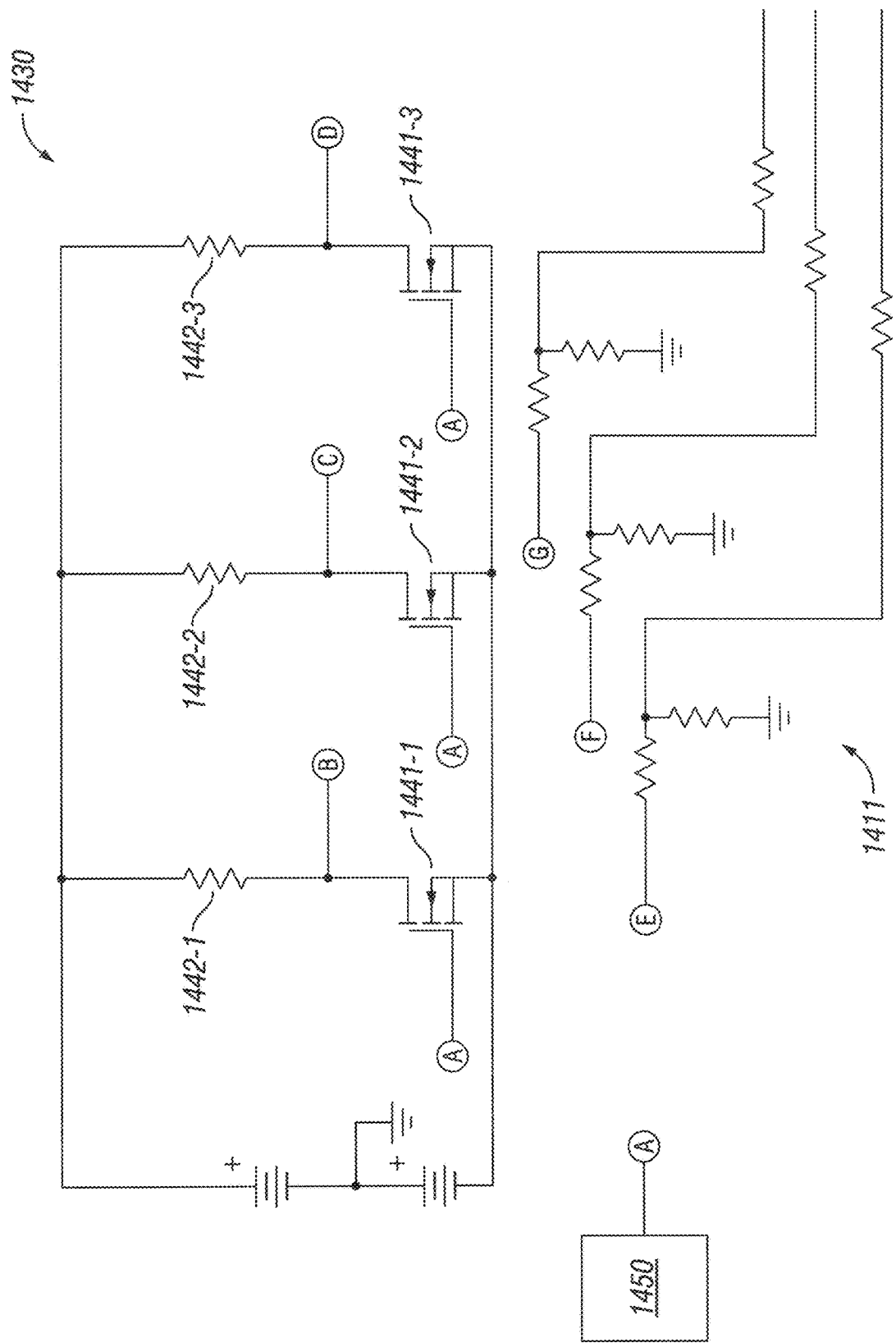
FIG. 14 shows a circuit diagram of another controller for a reefer receptacle in accordance with certain example embodiments.

FIG. 14 shows a circuit diagram of another controller 1430 for a reefer receptacle in accordance with certain example embodiments. The controller 1430 of FIG. 14 can be substantially similar to the controller 630 of FIG. 6, except that in this case, the energy metering module 1411 (described in more detail below with respect to FIG. 17), is a separate circuit that is placed at a different location in the system relative to the rest of the controller 630. For example, the energy metering module 1411 can be coupled to the plug (e.g., plug 431) of a reefer receptacle, while the rest of the controller 1430 can be coupled to the line side of the breaker (e.g., breaker 429) of the reefer receptacle.

A benefit of having the energy metering module 1411 physically separated from the rest of the controller 1430 is that an electrical open within the system between the energy metering module 1411 and the rest of the controller 1430 can be detected. Such a configuration can require one or more additional electrical conductors. If the energy metering module 1411 is co-located with the rest of the controller 1430, then an electrical open in the system may not be detected. In such a case, nodes B and E can be a common connection point, nodes C and F can be a common connection point, and nodes D and G can be a common connection point. Regardless of whether the energy metering module 1411 is co-located with the rest of the controller 1430, the electrical conductors (e.g., electrical conductor 1392, electrical conductor 1393) of the controller 1430 can be connected (as denoted by nodes B, C, D, E, F, and G in FIG. 14) to any part (e.g., line side of the breaker, load side of the breaker, line side of the contactor, load side of the contactor) of the system (e.g., system 1300).

Figure 15:
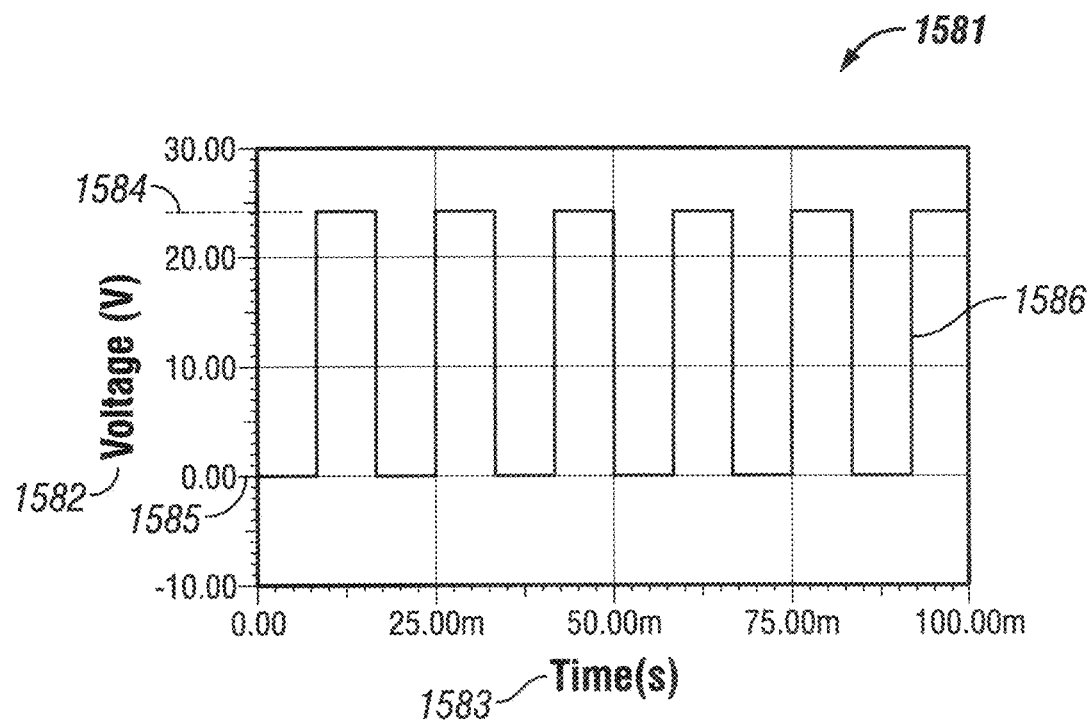
FIGS. 15 and 16 show graphical examples of how an example controller can be used to detect various faults in the electrical cable and/or connector that feeds power to a reefer container.
Figure 16:
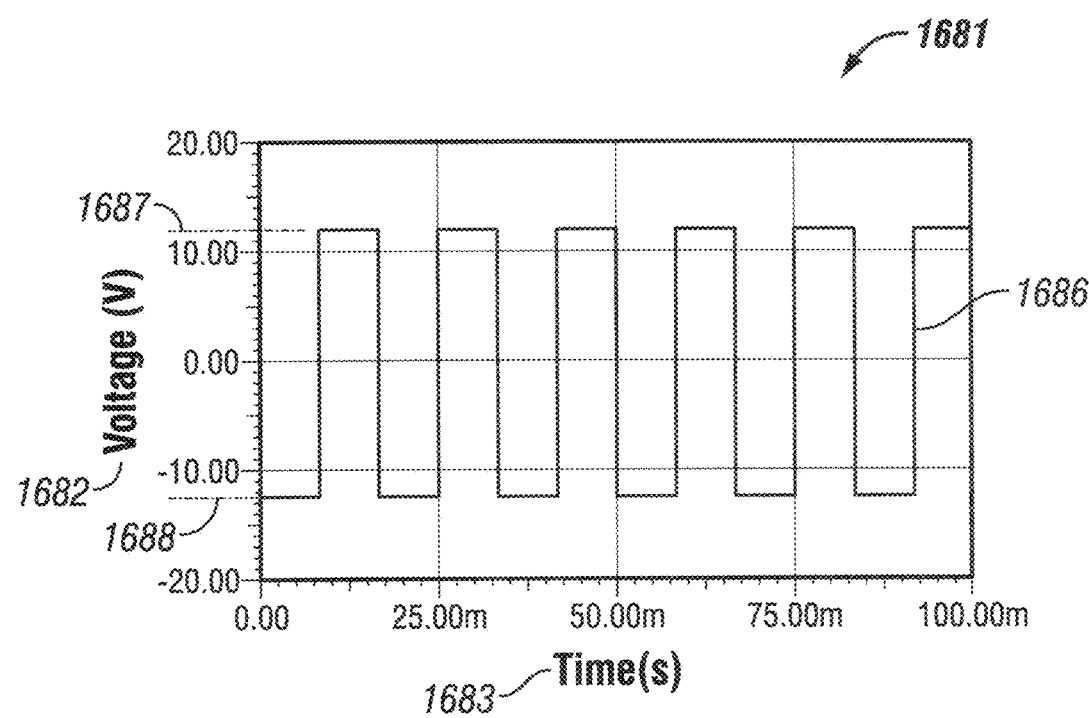

FIGS. 15 and 16 show graphical examples of how an example controller can be used to detect various faults in the electrical cable and/or connector that feeds power to a reefer container. Specifically, the graph 1581 of FIG. 15 includes a plot of a test signal 1586 (received, for example, by electrical conductor 1393 of FIG. 13), varying between approximately 0 VRMS (corresponding to voltage at 1585) and 24 VRMS (corresponding to voltage at 1584) in a square wave pattern. The graph 1581 nominally plots RMS voltage 1582 along the vertical axis against time 1583 along the horizontal axis.

When a zero-crossing is involved, the graph 1581 of FIG. 15 can be shifted, as shown with the graph 1681 of FIG. 16. The graph 1681 of FIG. 16 includes a plot of a test signal 1686 (received, for example, by electrical conductor 1393 of FIG. 13), varying between approximately −12 VRMS (corresponding to voltage at 1688) and +12 VRMS (corresponding to voltage at 1687) in a square wave pattern. The graph 1681 nominally plots RMS voltage 1682 along the vertical axis against time 1683 along the horizontal axis.

Figure 17:
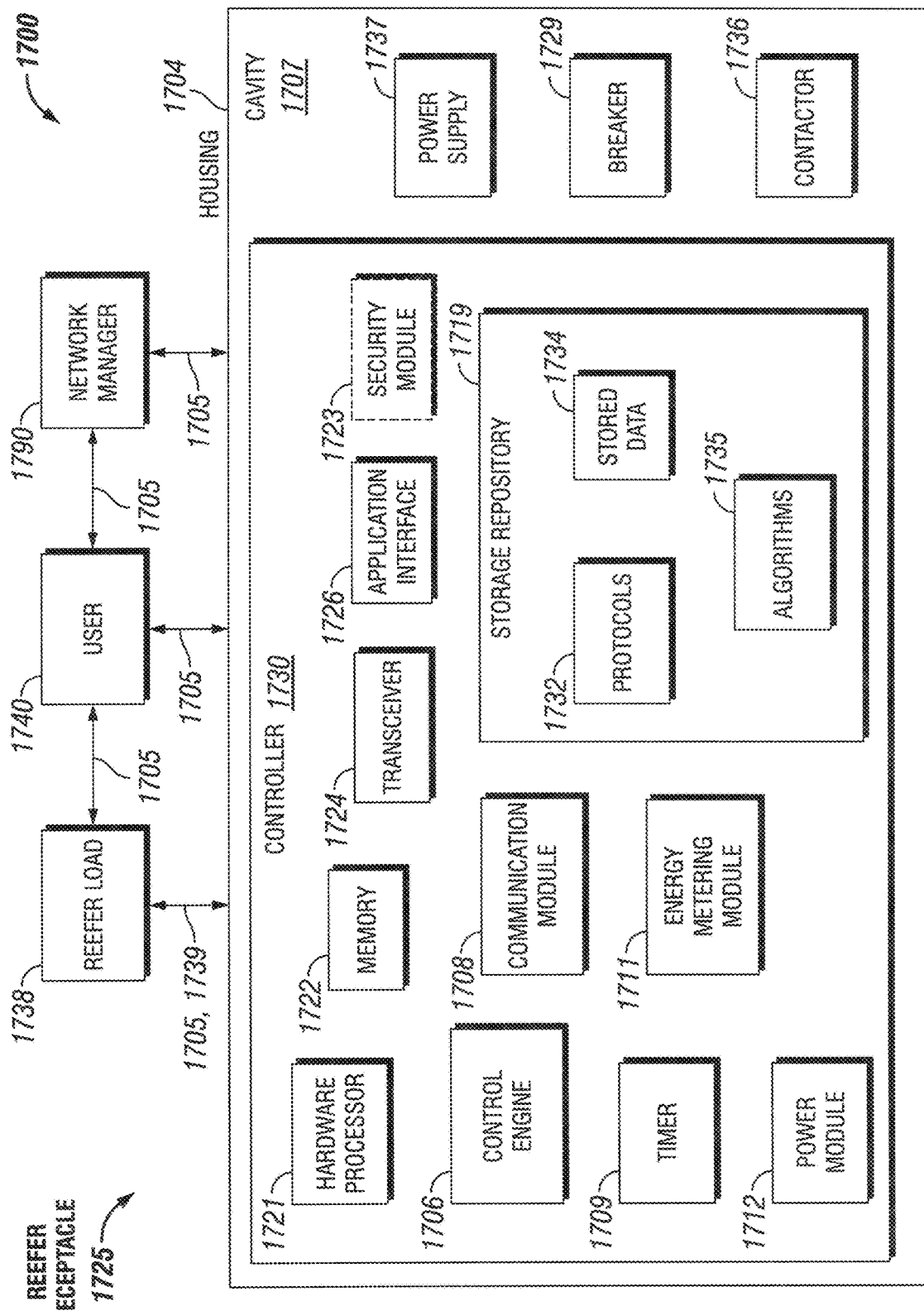
FIG. 17 shows a system diagram of an electrical system in accordance with certain example embodiments.

FIG. 17 shows a diagram of a system 1700 that includes an controller 1730 of a reefer receptacle 1725 in accordance with certain example embodiments. The system 1700 can also include a user 1740, a network manager 1790, and a reefer load 1738. In addition to the controller 1730, the reefer receptacle 1725 can include one or more of a number of other components, including but not limited to a power supply 1737, a contactor 1736 (or, more generally, an electrical interlock 1736, as described above), and a breaker 1729. The reefer load 1738, the breaker 1729, and the contactor 1736 can be substantially the same as the reefer load, the breaker, and the contactor described above with respect to FIGS. 4 and 5. In some cases, portions (e.g., breaker 1729, contactor 1736) of the reefer receptacle 1725 can be considered part of the reefer load 1738 for purposes of testing by the controller 1730.

The controller 1730 can include one or more of a number of components. Such components, can include, but are not limited to, an control engine 1706, a communication module 1708, a timer 1709, an energy metering module 1711, a power module 1712, a storage repository 1719, a hardware processor 1750, a memory 1722, a transceiver 1724, an application interface 1726, and, optionally, a security module 1723. The components shown in FIG. 17 are not exhaustive, and in some embodiments, one or more of the components shown in FIG. 17 may not be included in an example reefer receptacle. Any component of the example reefer receptacle 1725 can be discrete or combined with one or more other components of the reefer receptacle 1725.

A user 1740 may be any person that interacts with reefer receptacles 1725 and/or reefer loads. Examples of a user 1740 may include, but are not limited to, an engineer, an electrician, a deckhand, a crane operator, an instrumentation and controls technician, an instrumentation and controls technician, a mechanic, an operator, a consultant, an inventory management system, an inventory manager, a foreman, a labor scheduling system, a contractor, and a manufacturer's representative. The user 1740 can use a user system (not shown), which may include a display (e.g., a GUI). The user 1740 interacts with (e.g., sends data to, receives data from) the controller 1730 of the reefer receptacle 1725 via the application interface 1726 (described below). The user 1740 can also interact with a network manager 1790 and/or a reefer load 1738 in the system 1700. Interaction between the user 1740 and the reefer receptacles 1725 (or components thereof, such as the controller 1730) and/or the network manager 1790 is conducted using communication links 1705.

Each communication link 1705 can include wired (e.g., Class 1 electrical cables, Class 2 electrical cables, electrical connectors, power line carrier, DALI, RS485) and/or wireless (e.g., Wi-Fi, visible light communication, cellular networking, Bluetooth, WirelessHART, ISA100) technology. For example, a communication link 1705 can be (or include) one or more electrical conductors that are coupled to the housing 1704 of a reefer receptacle 1725. The communication link 1705 can transmit signals (e.g., power signals, communication signals, control signals, data) between one or more reefer receptacles 1725 and the user 1740 and/or the network manager 1790. In other words, a communication link 1705 as defined herein is not limited to the transmittal of only communication signals. In addition, or in the alternative, one or more electrical conductors 1739 (a kind of communication link) can be used to transmit power between the reefer receptacle 1725 and the reefer load 1738.

The network manager 1790 is a device or component that controls all or a portion of a communication network that includes the controller 1730 of the reefer receptacle 1725 and the additional reefer receptacles 1725 (including components thereof) that are communicably coupled to the controller 1730. The network manager 1790 can be substantially similar to the controller 1730. Alternatively, the network manager 1790 can include one or more of a number of features in addition to, or altered from, the features of the controller 1730 described below. As described herein, communication with the network manager 1790 can include communicating with one or more other components (e.g., another reefer receptacle 1725) of the system 1700. In such a case, the network manager 1790 can facilitate such communication.

The user 1740, the network manager 1790, and/or the reefer load 1738 can interact with the controller 1730 of the reefer receptacle 1725 using the application interface 1726 in accordance with one or more example embodiments. Specifically, the application interface 1726 of the controller 1730 receives data (e.g., information, communications, instructions, updates to firmware) from and sends data (e.g., information, communications, instructions) to the user 1740, the network manager 1790, and/or each other reefer receptacle 1725. The user 1740, the network manager 1790, and/or each other reefer receptacle 1725 can include an interface to receive data from and send data to the controller 1730 in certain example embodiments. Examples of such an interface can include, but are not limited to, a graphical user interface, a touchscreen, an application programming interface, a keyboard, a monitor, a mouse, a web service, a data protocol adapter, some other hardware and/or software, or any suitable combination thereof.

The controller 1730, the user 1740, the network manager 1790, and/or the reefer load 1738 can use their own system or share a system in certain example embodiments. Such a system can be, or contain a form of, an Internet-based or an intranet-based computer system that is capable of communicating with various software. A computer system includes any type of computing device and/or communication device, including but not limited to the controller 1730. Examples of such a system can include, but are not limited to, a desktop computer with LAN, WAN, Internet or intranet access, a laptop computer with LAN, WAN, Internet or intranet access, a smart phone, a server, a server farm, an android device (or equivalent), a tablet, smartphones, and a personal digital assistant (PDA). Such a system can correspond to a computer system as described below with regard to FIG. 18.

Further, as discussed above, such a system can have corresponding software (e.g., user software, controller software, network manager software). The software can execute on the same or a separate device (e.g., a server, mainframe, desktop personal computer (PC), laptop, personal desktop assistant (PDA), television, cable box, satellite box, kiosk, telephone, mobile phone, or other computing devices) and can be coupled by the communication network (e.g., Internet, Intranet, Extranet, Local Area Network (LAN), Wide Area Network (WAN), or other network communication methods) and/or communication channels, with wire and/or wireless segments according to some example embodiments. The software of one system can be a part of, or operate separately but in conjunction with, the software of another system within the system 1700. The reefer receptacle 1725 can include a housing 1704. The housing 1704 can include at least one wall that forms a cavity 1707. In some cases, the housing 1704 can be designed to comply with any applicable standards so that the reefer receptacle 1725 can be located in a particular environment (e.g., a hazardous environment).

The housing 1704 of the reefer receptacle 1725 can be used to house one or more components of the reefer receptacle 1725, including one or more components of the controller 1730. For example, as shown in FIG. 17, the controller 1730 (which in this case includes the control engine 1706, the communication module 1708, the timer 1709, the energy metering module 1711, the power module 1712, the storage repository 1719, the hardware processor 1750, the memory 1722, the transceiver 1724, the application interface 1726, and the optional security module 1723) and the power supply 1737 are disposed in the cavity 1707 formed by the housing 1704. In alternative embodiments, any one or more of these or other components of the reefer receptacle 1725 can be disposed on the housing 1704 and/or remotely from the housing 1704.

The storage repository 1719 can be a persistent storage device (or set of devices) that stores software and data used to assist the controller 1730 in communicating with the user 1740, the network manager 1790, and the reefer load 1738 within the system 1700. In one or more example embodiments, the storage repository 1719 stores one or more protocols 1732, algorithms 1735, and stored data 1734. The protocols 1732 can include any of a number of communication protocols that are used to send and/or receive data between the controller 1730 and the user 1740, the network manager 1790, and the reefer load 1738. A protocol 1732 can also include one or more processes for testing a reefer load 1738 in the system 1700. One or more of the protocols 1732 can be a time-synchronized protocol. Examples of such time-synchronized protocols can include, but are not limited to, a highway addressable remote transducer (HART) protocol, WiFi, ZigBee, a wirelessHART protocol, and an International Society of Automation (ISA) 100 protocol. In this way, one or more of the protocols 1732 can provide a layer of security to the data transferred within the system 1700.

The algorithms 1735 can be any procedures (e.g., a series of method steps), formulas, logic steps, mathematical models, and/or other similar operational procedures that the control engine 1706 of the controller 1730 follows based on certain conditions at a point in time. An example of an algorithm 1735 is a formula to determine whether an adverse electrical condition (e.g., a short, an open) exists in the system 1700 based on one or more measurements made by the energy metering module 1711. The control engine 1706 can then store the results as stored data 1734 in the storage repository 1719.

Algorithms 1735 can be focused on testing the integrity of the reefer load 1738 in the system 1700. An algorithm 1735 can be fixed or modified (e.g., by a user 1740, by the control engine 1706) over time. Modification of an algorithm 1735 can be based on one or more of a number of factors, including but not limited to new equipment (e.g., a new transceiver 1724) and correction based on actual data.

Stored data 1734 can be any data (e.g., processing speed) associated with the reefer receptacle 1725 any components thereof), data associated with the reefer load 1738, measurements taken by the energy metering module 1711, threshold values, results of previously run or calculated algorithms, and/or any other suitable data. Such data can be any type of data, including but not limited to historical data for the reefer receptacle 1725, historical data for the reefer load 1738, calculations, an identification number of the reefer receptacle 1725, and measurements taken by the energy metering module 1711. The stored data 1734 can be associated with some measurement of time derived, for example, from the timer 1709.

Examples of a storage repository 1719 can include, but are not limited to, a database (or a number of databases), a file system, a hard drive, flash memory, some other form of solid state data storage, or any suitable combination thereof. The storage repository 1719 can be located on multiple physical machines, each storing all or a portion of the protocols 1732, the algorithms 1735, and/or the stored data 1734 according to some example embodiments. Each storage unit or device can be physically located in the same or in a different geographic location.

The storage repository 1719 can be operatively connected to the control engine 1706. In one or more example embodiments, the control engine 1706 includes functionality to communicate with the user 1740, and the network manager 1790 in the system 1700. More specifically, the control engine 1706 sends information to and/or receives information from the storage repository 1719 in order to communicate with the user 1740, the network manager 1790, and the reefer receptacles 1725. As discussed below, the storage repository 1719 can also be operatively connected to the communication module 1708 in certain example embodiments.

In certain example embodiments, the control engine 1706 of the controller 1730 controls the operation of one or more components (e.g., the communication module 1708, the timer 1709, the transceiver 1724) of the controller 1730. For example, the control engine 1706 can activate the communication module 1708 when the communication module 1708 is in "sleep" mode and when the communication module 1708 is needed to send data received from another component (e.g., the network manager 1790, the user 1740) in the system 1700.

As another example, the control engine 1706 can acquire the current time using the timer 1709. The timer 1709 can enable the controller 1730 to control the reefer receptacle 1725 even when the controller 1730 has no communication with the network manager 1790. As yet another example, the control engine 1706 can direct the energy metering module 1711 to measure and send power consumption information of the reefer receptacle 1725 to the network manager 1790.

The control engine 1706 can be configured to perform a number of functions that help test the integrity of the reefer receptacle 1725 (or components thereof) and/or the reefer load 1738 in the system 1700. As discussed above, the control engine 1706 can execute any of the algorithms 1735 stored in the storage repository 1719. In certain example embodiments, the control engine 1706 controls the characteristics (e.g., frequency, voltage level, length of time) of the signals sent in the system 1700. Other capabilities (e.g., self-test, testing for electrical opens in the system 1700, approximate location of an electrical fault, lockout capability upon detecting an adverse electrical condition) of the controller 1730 are described above, for example, with respect to the controller 430 of FIG. 4, the controller 530 of FIG. 5, and the controller 1330 of FIG. 13.

The control engine 1706 can provide control, communication, and/or other similar signals to the user 1740, the network manager 1790, and the reefer load 1738. Similarly, the control engine 1706 can receive control, communication, and/or other similar signals from the user 1740, the network manager 1790, and the reefer load 1738. The control engine 1706 may include a printed circuit board, upon which the hardware processor 1750 and/or one or more discrete components of the controller 1730 are positioned.

In certain embodiments, the control engine 1706 of the controller 1730 can communicate with one or more components of a system external to the system 1700 in furtherance of testing the integrity of the reefer receptacle 1725 and the reefer load 1738 in the system 1700. For example, the control engine 1706 can interact with an inventory management system by ordering a replacement part for a reefer receptacle 1725 that the control engine 1706 has determined to fail or be failing. As another example, the control engine 1706 can interact with a workforce scheduling system by scheduling a maintenance crew to repair or replace the reefer receptacle 1725 (or portion thereof) when the control engine 1706 determines that the reefer receptacle 1725 or portion thereof requires maintenance or replacement. In this way, the controller 1730 is capable of performing a number of functions beyond what could reasonably be considered a routine task.

In certain example embodiments, the control engine 1706 can include an interface that enables the control engine 1706 to communicate with one or more components (e.g., power supply 1737) of the reefer receptacle 1725. For example, if the power supply 1737 of the reefer receptacle 1725 operates under IEC Standard 62386, then the power supply 1737 can have a serial communication interface that will transfer data (e.g., stored data 1734). In such a case, the control engine 1706 can also include a serial interface to enable communication with the power supply 1737 within the reefer receptacle 1725. Such an interface can operate in conjunction with, or independently of, the protocols 1732 used to communicate between the controller 1730 and the user 1740, the network manager 1790, and the reefer load 1738.

The control engine 1706 (or other components of the controller 1730) can also include one or more hardware components and/or software elements to perform its functions. Such components can include, but are not limited to, a universal asynchronous receiver/transmitter (UART), a serial peripheral interface (SPI), a direct-attached capacity (DAC) storage device, an analog-to-digital converter, an inter-integrated circuit ($I^2C$), and a pulse width modulator (PWM).

The communication module 1708 of the controller 1730 determines and implements the communication protocol (e.g., from the protocols 1732 of the storage repository 1719) that is used when the control engine 1706 communicates with (e.g., sends signals to, receives signals from) the user 1740, the network manager 1790, and/or the reefer load 1738. In some cases, the communication module 1708 accesses the stored data 1734 to determine which communication protocol is used to communicate with the other reefer receptacle 1725 associated with the stored data 1734. In addition, the communication module 1708 can interpret the communication protocol of a communication received by the controller 1730 so that the control engine 1706 can interpret the communication.

The communication module 1708 can send and receive data between the network manager 1790, the reefer load 1738, and/or the users 1740 and the controller 1730. The communication module 1708 can send and/or receive data in a given format that follows a particular protocol 1732. The control engine 1706 can interpret the data packet received from the communication module 1708 using the protocol 1732 information stored in the storage repository 1719. The control engine 1706 can also facilitate the data transfer between the network manager 1790, the reefer load 1738, and/or a user 1740 by converting the data into a format understood by the communication module 1708.

The communication module 1708 can send data (e.g., protocols 1732, algorithms 1735, stored data 1734, operational information, alarms) directly to and/or retrieve data directly from the storage repository 1719. Alternatively, the control engine 1706 can facilitate the transfer of data between the communication module 1708 and the storage repository 1719. The communication module 1708 can also provide encryption to data that is sent by the controller 1730 and decryption to data that is received by the controller 1730. The communication module 1708 can also provide one or more of a number of other services with respect to data sent from and received by the controller 1730. Such services can include, but are not limited to, data packet routing information and procedures to follow in the event of data interruption.

The timer 1709 of the controller 1730 can track clock time, intervals of time, an amount of time, and/or any other measure of time. The timer 1709 can also count the number of occurrences of an event, whether with or without respect to time. Alternatively, the control engine 1706 can perform the counting function. The timer 1709 is able to track multiple time measurements concurrently. The timer 1709 can track time periods based on an instruction received from the control engine 1706, based on an instruction received from the user 1740, based on an instruction programmed in the software for the controller 1730, based on some other condition or from some other component, or from any combination thereof.

The timer 1709 can be configured to track time when there is no power delivered to the controller 1730 (e.g., the power module 1712 malfunctions) using, for example, a super capacitor or a battery backup. In such a case, when there is a resumption of power delivery to the controller 1730, the timer 1709 can communicate any aspect of time to the controller 1730. In such a case, the timer 1709 can include one or more of a number of components (e.g., a super capacitor, an integrated circuit) to perform these functions.

The energy metering module 1711 of the controller 1730 measures one or more components of power (e.g., current, voltage, resistance, VARs, watts) associated with the reefer receptacle 1725 at one or more points. The energy metering module 1711 can include any of a number of measuring devices and related devices, including but not limited to a voltmeter, an ammeter, a power meter, an ohmmeter, a current transformer, a potential transformer, and electrical wiring. The energy metering module 1711 can measure a component of power continuously, periodically, based on the occurrence of an event, based on a command received from the control engine 1706, and/or based on some other factor.

The power module 1712 of the controller 1730 provides power to one or more other components (e.g., timer 1709, control engine 1706) of the controller 1730. In addition, in certain example embodiments, the power module 1712 can provide power to the power supply 1737 of the reefer receptacle 1725. The power module 1712 can include one or more of a number of single or multiple discrete components (e.g., transistor, diode, resistor), and/or a microprocessor. The power module 1712 may include a printed circuit board, upon which the microprocessor and/or one or more discrete components are positioned. In some cases, the power module 1712 can include one or more components that allow the power module 1712 to measure one or more elements of power (e.g., voltage, current) that is delivered to and/or sent from the power module 1712, Alternatively, the controller 1730 can include a power metering module (not shown) to measure one or more elements of power that flows into, out of, and/or within the controller 1730.

The power module 1712 can include one or more components (e.g., a transformer, a diode bridge, an inverter, a converter) that receives power (for example, through an electrical cable) from a source external to the reefer receptacle 1725 and generates power of a type (e.g., alternating current, direct current) and level (e.g., 12V, 24V, 120V) that can be used by the other components of the controller 1730 and/or by the power supply 1737. The power module 1712 can use a closed control loop to maintain a preconfigured voltage or current with a tight tolerance at the output. The power module 1712 can also protect the rest of the electronics (e.g., hardware processor 1750, transceiver 1724) in the reefer receptacle 1725 from surges generated in the line.

In addition, or in the alternative, the power module 1712 can be a source of power in itself to provide signals to the other components of the controller 1730 and/or the power supply 1737. For example, the power module 1712 can be a battery. As another example, the power module 1712 can be a localized photovoltaic power system.

The hardware processor 1750 of the controller 1730 executes software, algorithms, and firmware in accordance with one or more example embodiments. Specifically, the hardware processor 1750 can execute software on the control engine 1706 or any other portion of the controller 1730, as well as software used by the user 1740, the network manager 1790, and/or the reefer load 1738. The hardware processor 1750 can be an integrated circuit, a central processing unit, a multi-core processing chip, SoC, a multi-chip module including multiple multi-core processing chips, or other hardware processor in one or more example embodiments. The hardware processor 1750 is known by other names, including but not limited to a computer processor, a microprocessor, and a multi-core processor.

In one or more example embodiments, the hardware processor 1750 executes software instructions stored in memory 1722. The memory 1722 includes one or more cache memories, main memory, and/or any other suitable type of memory. The memory 1722 can include volatile and/or non-volatile memory. The memory 1722 is discretely located within the controller 1730 relative to the hardware processor 1750 according to some example embodiments. In certain configurations, the memory 1722 can be integrated with the hardware processor 1750.

In certain example embodiments, the controller 1730 does not include a hardware processor 1750. In such a case, the controller 1730 can include, as an example, one or more field programmable gate arrays (FPGA). Using FPGAs and/or other similar devices known in the art allows the controller 1730 (or portions thereof) to be programmable and function according to certain logic rules and thresholds without the use of a hardware processor. Alternatively, FPGAs and/or similar devices can be used in conjunction with one or more hardware processors 1750.

The transceiver 1724 of the controller 1730 can send and/or receive control and/or communication signals. Specifically, the transceiver 1724 can be used to transfer data between the controller 1730 and the user 1740, the network manager 1790, and/or the reefer load 1738. The transceiver 1724 can use wired and/or wireless technology. The transceiver 1724 can be configured in such a way that the control and/or communication signals sent and/or received by the transceiver 1724 can be received and/or sent by another transceiver that is part of the user 1740, the network manager 1790, and/or the reefer load 1738. The transceiver 1724 can use any of a number of signal types, including but not limited to radio frequency signals.

When the transceiver 1724 uses wireless technology, any type of wireless technology can be used by the transceiver 1724 in sending and receiving signals. Such wireless technology can include, but is not limited to, Wi-Fi, visible light communication, cellular networking, and Bluetooth. The transceiver 1724 can use one or more of any number of suitable communication protocols (e.g., ISA100, HART) when sending and/or receiving signals. Such communication protocols can be stored in the protocols 1732 of the storage repository 1719. Further, any transceiver information for the user 1740, and/or the network manager 1790 can be part of the stored data 1734 (or similar areas) of the storage repository 1719.

Optionally, in one or more example embodiments, the security module 1723 secures interactions between the controller 1730, the user 1740, and/or the network manager 1790. More specifically, the security module 1723 authenticates communication from software based on security keys verifying the identity of the source of the communication. For example, user software may be associated with a security key enabling the software of the user 1740 to interact with the controller 1730. Further, the security module 1723 can restrict receipt of information, requests for information, and/or access to information in some example embodiments.

The power supply 1737 of the reefer receptacle 1725 provides power to one or more components of the reefer receptacle 1725. The power supply 1737 can be substantially the same as, or different than, the power module 1712 of the controller 1730. The power supply 1737 can include one or more of a number of single or multiple discrete components (e.g., transistor, diode, resistor), and/or a microprocessor. The power supply 1737 may include a printed circuit board upon which the microprocessor and/or one or more discrete components are positioned.

The power supply 1737 can include one or more components (e.g., a transformer, a diode bridge, an inverter, a converter) that receives power (for example, through an electrical cable) from the power module 1712 of the controller 1730 and generates power of a type (e.g., alternating current, direct current) and level (e.g., 12V, 24V, 120V) that can be used by one or more components of the reefer container 1725. In addition, or in the alternative, the power supply 1737 can receive power from a source external to the reefer receptacle 1725. In addition, or in the alternative, the power supply 1737 can be a source of power in itself. For example, the power supply 1737 can be a battery, a localized photovoltaic power system, or some other source of independent power.

As stated above, one or more of the reefer receptacles 1725 can be placed in any of a number of environments. In such a case, the housing 1704 of the reefer receptacle 1725 can be configured to comply with applicable standards for any of a number of environments. For example, the reefer receptacle 1725 can be rated as a Division 1 or a Division 2 enclosure under NEC standards. Similarly, any other devices communicably coupled to the reefer receptacle 1725 can be configured to comply with applicable standards for any of a number of environments.

Figure 18:
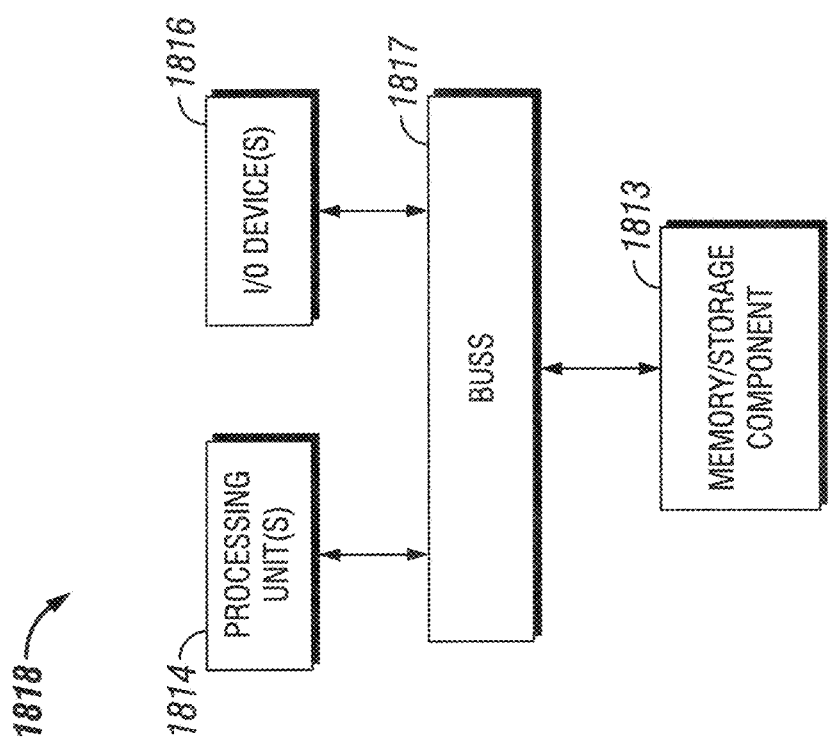
FIG. 18 shows a computing device in accordance with certain example embodiments.

FIG. 18 illustrates one example embodiment of a computing device 1818 that implements one or more of the various techniques described herein, and which is representative, in whole or in part, of the elements described herein pursuant to certain example embodiments. Computing device 1818 is one example of a computing device and is not intended to suggest any limitation as to scope of use or functionality of the computing device and/or its possible architectures. Neither should computing device 1818 be interpreted as having any dependency or requirement relating to any one or combination of components illustrated in the example computing device 1818.

Computing device 1818 includes one or more processors or processing units 1814, one or more memory/storage components 1813, one or more input/output (I/O) devices 1816, and a bus 1817 (also spelled buss 1817) that allows the various components and devices to communicate with one another. Bus 1817 represents one or more of any of several types of bus structures, including a memory bus or memory controller, a peripheral bus, an accelerated graphics port, and a processor or local bus using any of a variety of bus architectures. Bus 1817 includes wired and/or wireless buses.

Memory/storage component 1813 represents one or more computer storage media. Memory/storage component 1813 includes volatile media (such as random access memory (RAM)) and/or nonvolatile media (such as read only memory (ROM), flash memory, optical disks, magnetic disks, and so forth). Memory/storage component 1813 includes fixed media (e.g., RAM, ROM, a fixed hard drive, etc.) as well as removable media (e.g., a Flash memory drive, a removable hard drive, an optical disk, and so forth).

One or more I/O devices 1816 allow a customer, utility, or other user to enter commands and information to computing device 1818, and also allow information to be presented to the customer, utility, or other user and/or other components or devices. Examples of input devices include, but are not limited to, a keyboard, a cursor control device (e.g., a mouse), a microphone, a touchscreen, and a scanner. Examples of output devices include, but are not limited to, a display device (e.g., a monitor or projector), speakers, outputs to a lighting network (e.g., DMX card), a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 1818 is connected to a network (not shown) (e.g., a local area network (LAN), a wide area network (WAN) such as the Internet, cloud, or any other similar type of network) via a network interface connection (not shown) according to some example embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other example embodiments. Generally speaking, the computer system 1818 includes at least the minimal processing, input, and/or output means necessary to practice one or more embodiments.

Further, those skilled in the art will appreciate that one or more elements of the aforementioned computer device 1818 is located at a remote location and connected to the other elements over a network in certain example embodiments. Further, one or more embodiments is implemented on a distributed system having one or more nodes, where each portion of the implementation (e.g., controller 1730) is located on a different node within the distributed system. In one or more embodiments, the node corresponds to a computer system. Alternatively, the node corresponds to a processor with associated physical memory in some example embodiments. The node alternatively corresponds to a processor with shared memory and/or resources in some example embodiments.

Figure 19:
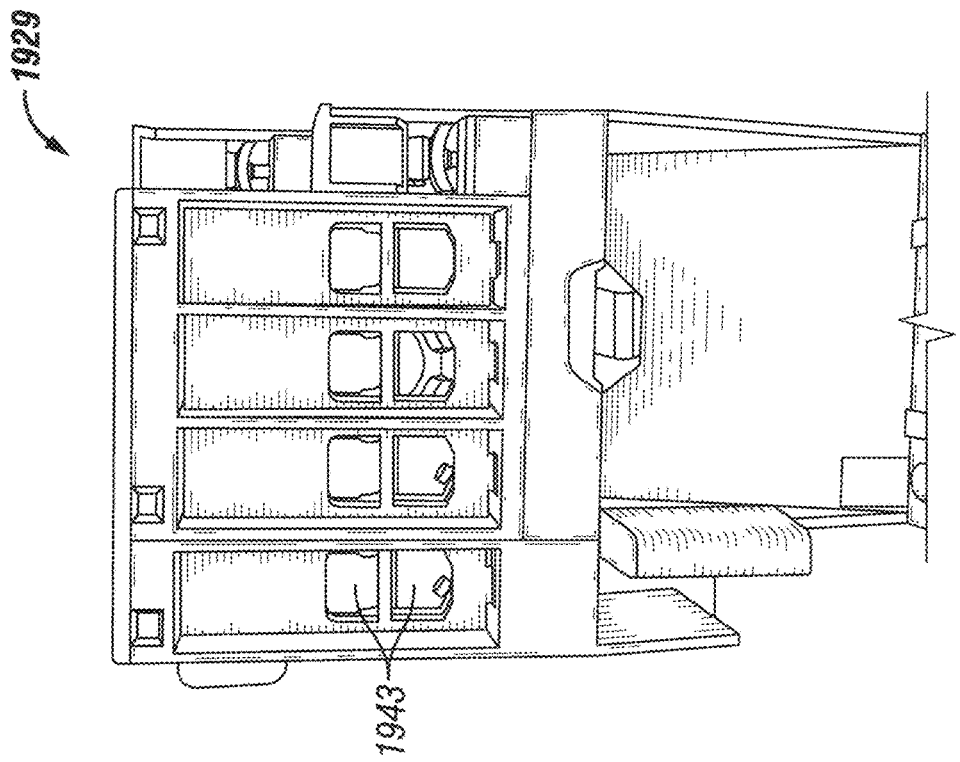
FIG. 19 shows a circuit breaker of a reefer receptacle in accordance with certain example embodiments.

FIG. 19 shows a circuit breaker 1929 for a reefer receptacle (e.g., reefer receptacle 1725) in accordance with certain example embodiments. In this example, there are two port lugs 1943 for each phase. This enables a power conductor (e.g., power conductor 1539) to be connected to one port lug 1943, and an electrical conductor (e.g., electrical conductor 1392, electrical conductor 1393) of a self-test circuit (e.g., self-test circuit 1391) to be connected to the other port lug 1943. A breaker 1929 can have more than two port lugs 1943 for one or more phases of power. For breakers with multiple port lugs, as with the breaker 1929 of FIG. 19, one or more of a number of applicable codes and/or regulations can be complied with.

Example embodiments can provide for measuring and monitoring the adverse electrical conditions (e.g., faults) for one or more components (e.g., electrical cable, connector) that provide power to a reefer receptacle of a reefer container. In some cases, the enclosures in which example embodiments are used are located in hazardous (e.g., explosion-proof) environments. As such, example embodiments can be used in environments where one or more applicable industry standards must be met. By evaluating the existence of adverse electrical conditions before allowing power to flow from an electrical cable assembly to the reefer receptacle, the risk of damage to equipment and/or personnel can be greatly reduced.

Example embodiments can include a controller determines whether an adverse electrical condition (e.g., a fault, an electrical open) exists. In addition, the controller can interactively communicate with a user (e.g., through the user interface, an alarm, an indicating light), a network manager, a maintenance department, an inventory management system, and/or any other entity that can be involved in the dissemination of information regarding the adverse electrical condition or lack thereof. Example embodiments have a number of benefits over the present art, including but not limited to reduced materials, simple installation and maintenance, increased reliability, enhanced user experience, and decreased risk of loss.

Also, while example embodiments described herein are directed to reefer containers, example embodiments can be used in a number of other applications aside from reefer containers. For example, example embodiments can be used in various hazardous and non-hazardous area installations where shock and fire hazards are a significant concern. As another example, example embodiments can be used with a temporary connection and/or other applications where an exposed electrical cable is subject to damage and poses a safety risk if compromised.

As yet another example, example embodiments can be used with residential outlets and other similar applications. With the effectiveness of example embodiments, one or more entities that maintain industry standards may incorporate the use of example embodiments (or the functional equivalent) into applicable standards. Further, example embodiments can have metering capability, which allows for some level of detection of a loss of phase or phase imbalance.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. A reefer receptacle comprising:
    a connector end configured to couple to an electrical load comprising an electrical cable and an electrical connector of a reefer container;
    an electrical interlock coupled to the connector end;
    a breaker coupled to the electrical interlock;
    a power supply coupled to the breaker; and
    a controller coupled to the power supply, wherein the controller is configured to perform at least one test to determine if an adverse electrical condition exists prior to putting the reefer container in service,
    wherein the controller is configured to determine whether the adverse electrical condition exists with respect to the electrical load before allowing operating power to flow between the connector end and the electrical connector of the reefer container,
    wherein the controller is further configured to determine a location of the adverse electrical condition along the electrical load when the adverse electrical condition is detected, and
    wherein the adverse electrical condition comprises at least one of a group consisting of a phase-to-phase fault, a loss of phase, and a phase-to-ground fault.

2. The reefer receptacle of claim 1, wherein the controller and the electrical interlock are electrically coupled in series with each other.

3. The reefer receptacle of claim 1, wherein the controller and the electrical interlock are electrically coupled in parallel with each other.

4. The reefer receptacle of claim 1, wherein the electrical interlock comprises at least one selected from a group consisting of a solenoid, a contactor, and a switch.

5. The reefer receptacle of claim 1, wherein the breaker comprises a first lug port and a second lug port, wherein the controller is coupled to the first lug port, and wherein a power conductor is coupled to the second lug port.

6. The reefer receptacle of claim 1, wherein the controller comprises a sensing circuit that is configured to identify the adverse electrical condition.

7. The reefer receptacle of claim 1, further comprising a plurality of resistors used to regulate test signals for performing the at least one test.

8. The reefer receptacle of claim 1, further comprising at least one pulse generator used to generate test signals for performing the at least one test.

9. The reefer receptacle of claim 1, wherein the controller is further configured to determine, when the adverse electrical condition comprises a phase-to-phase fault, a phase on which the phase-to-phase fault is located.

10. The reefer receptacle of claim 1, wherein the controller comprises a self-test circuit, wherein the self-test circuit comprises at least one switch for performing the at least one test.

11. The reefer receptacle of claim 10, wherein the at least one switch controls, while performing the at least one test, when a response signal is received by the controller from the electrical load.

12. The reefer receptacle of claim 1, wherein the controller comprises an energy metering module that is coupled to a first portion of the electrical load, and wherein a remainder of the controller is coupled to a second portion of the electrical load.

13. The reefer receptacle of claim 12, wherein the controller identifies an electrical open between the first portion of the electrical load and the second portion of the electrical load.

* * * * *